(12) United States Patent
Tomizawa et al.

(10) Patent No.: US 8,987,764 B2
(45) Date of Patent: Mar. 24, 2015

(54) SEMICONDUCTOR LIGHT EMITTING DEVICE AND LIGHT SOURCE UNIT

(71) Applicant: Kabushiki Kaisha Toshiba, Minato-ku, Tokyo (JP)

(72) Inventors: Hideyuki Tomizawa, Kanagawa-ken (JP); Akihiro Kojima, Kanagawa-ken (JP); Miyoko Shimada, Kanagawa-ken (JP); Yosuke Akimoto, Kanagawa-ken (JP); Yoshiaki Sugizaki, Kanagawa-ken (JP); Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/779,690

(22) Filed: Feb. 27, 2013

(65) Prior Publication Data

US 2013/0313589 A1    Nov. 28, 2013

(30) Foreign Application Priority Data

May 25, 2012    (JP) ................. 2012-120067

(51) Int. Cl.
*H01L 33/48*    (2010.01)
*H01L 33/56*    (2010.01)

(52) U.S. Cl.
CPC ............... *H01L 33/48* (2013.01); *H01L 33/56* (2013.01)
USPC .. 257/98; 257/88; 257/E27.12; 257/E33.061; 257/E33.073

(58) Field of Classification Search
CPC ......... H01L 33/32; H01L 33/44; H01L 33/48; H01L 33/56; H01L 33/62; H01L 33/75
See application file for complete search history.

(56) References Cited

U.S. PATENT DOCUMENTS 8,110,421 B2    2/2012    Sugizaki et al.
2004/0061433 A1    4/2004    Izuno et al.
(Continued)

FOREIGN PATENT DOCUMENTS

EP    1 538 682 A2    6/2005
EP    1 919 000 A1    5/2008
(Continued)

OTHER PUBLICATIONS

Extended European Search Report (EESR) dated Aug. 6, 2013 (in English) in counterpart European Application No. 13156741.4.
(Continued)

*Primary Examiner* — Minh-Loan Tran
*Assistant Examiner* — Fazli Erdem
(74) *Attorney, Agent, or Firm* — Holtz, Holtz, Goodman & Chick PC

(57) ABSTRACT

According to an embodiment, a semiconductor light emitting device includes a semiconductor layer, a p-side electrode, n-side electrode and a resin layer. The semiconductor layer has a first face and a second face opposite to the first face, and includes a light emitting layer. The p-side electrode is provided on the semiconductor layer on the second face side. The n-side electrode is provided on the semiconductor layer on the second face side. The resin layer is provided on the first face and transmits light emitted from the light emitting layer, the resin layer including a top surface opposite to the first face and four side faces provided along an outer edge of the first face and connected to the top surface, the resin layer including a scattering substance scattering the light emitted from the light emitting layer.

21 Claims, 25 Drawing Sheets

(56) References Cited

U.S. PATENT DOCUMENTS

| | | | |
|---|---|---|---|
| 2008/0277674 A1* | 11/2008 | Nagai et al. .................... | 257/88 |
| 2008/0297047 A1 | 12/2008 | Kohno et al. | |
| 2009/0134415 A1 | 5/2009 | Morioka | |
| 2011/0084294 A1* | 4/2011 | Yao ................................. | 257/93 |
| 2011/0147778 A1* | 6/2011 | Ichikawa ........................ | 257/98 |
| 2011/0193123 A1 | 8/2011 | Moon et al. | |
| 2011/0260184 A1 | 10/2011 | Furuyama | |
| 2011/0291148 A1* | 12/2011 | Sugizaki et al. ............... | 257/99 |
| 2011/0297983 A1 | 12/2011 | Nishiuchi et al. | |
| 2011/0300644 A1 | 12/2011 | Akimoto et al. | |
| 2012/0241792 A1* | 9/2012 | Obata et al. .................... | 257/98 |
| 2013/0320382 A1* | 12/2013 | Kojima et al. ................. | 257/98 |
| 2013/0320383 A1* | 12/2013 | Izuka et al. .................... | 257/98 |
| 2013/0334539 A1* | 12/2013 | Kojima et al. ................. | 257/76 |

FOREIGN PATENT DOCUMENTS

| | | |
|---|---|---|
| EP | 2 065 948 A2 | 6/2009 |
| EP | 2 390 936 A1 | 11/2011 |
| JP | 08-298341 A | 11/1996 |
| JP | 2004-281863 A | 10/2004 |
| TW | 201220560 A | 5/2012 |

OTHER PUBLICATIONS

Extended European Search Report dated Sep. 19, 2014 in counterpart European Application No. 14172379.1.

Taiwanese Office Action dated Oct. 29, 2014, issued in counterpart Taiwanese Application No. 102104205.

* cited by examiner

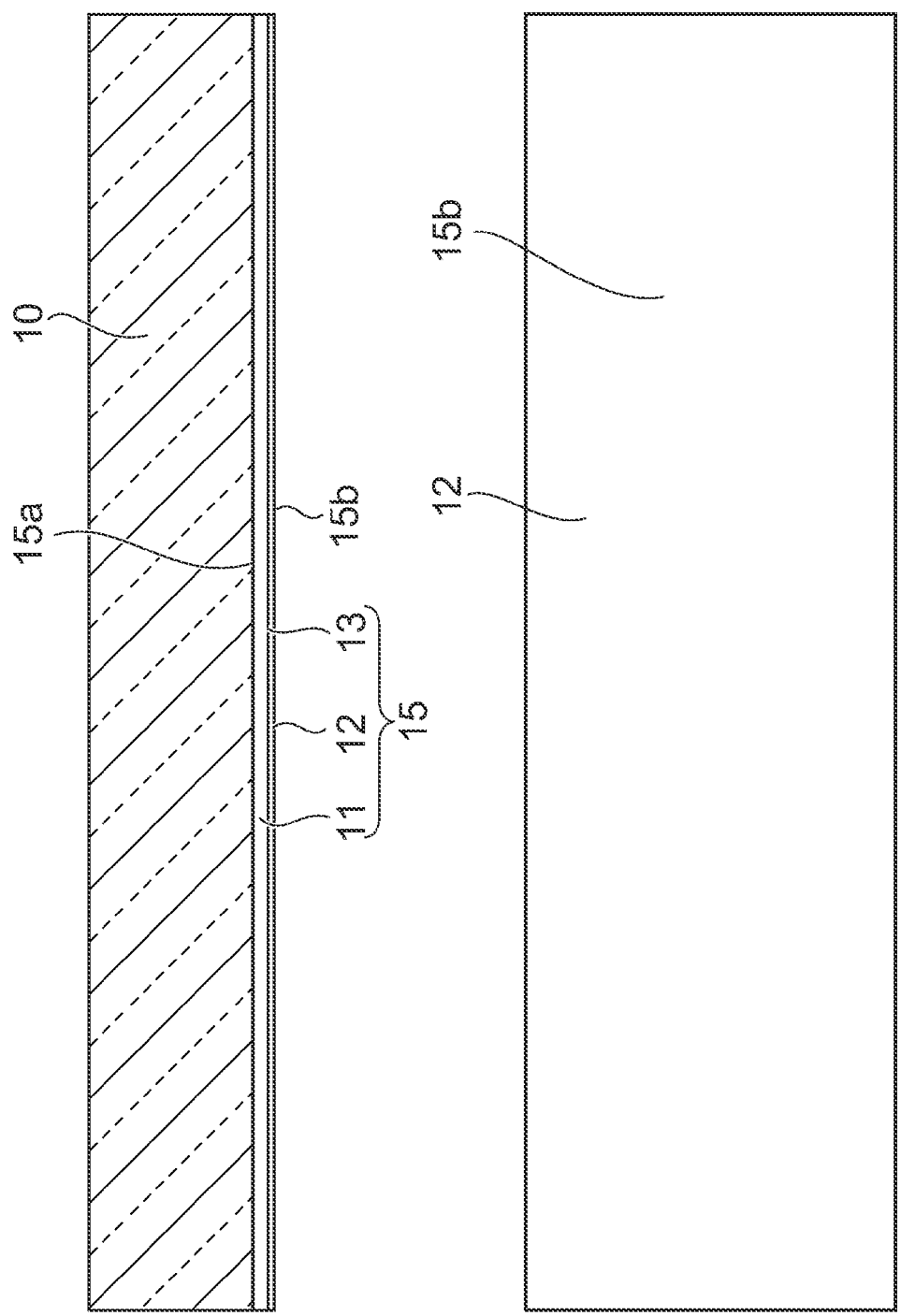

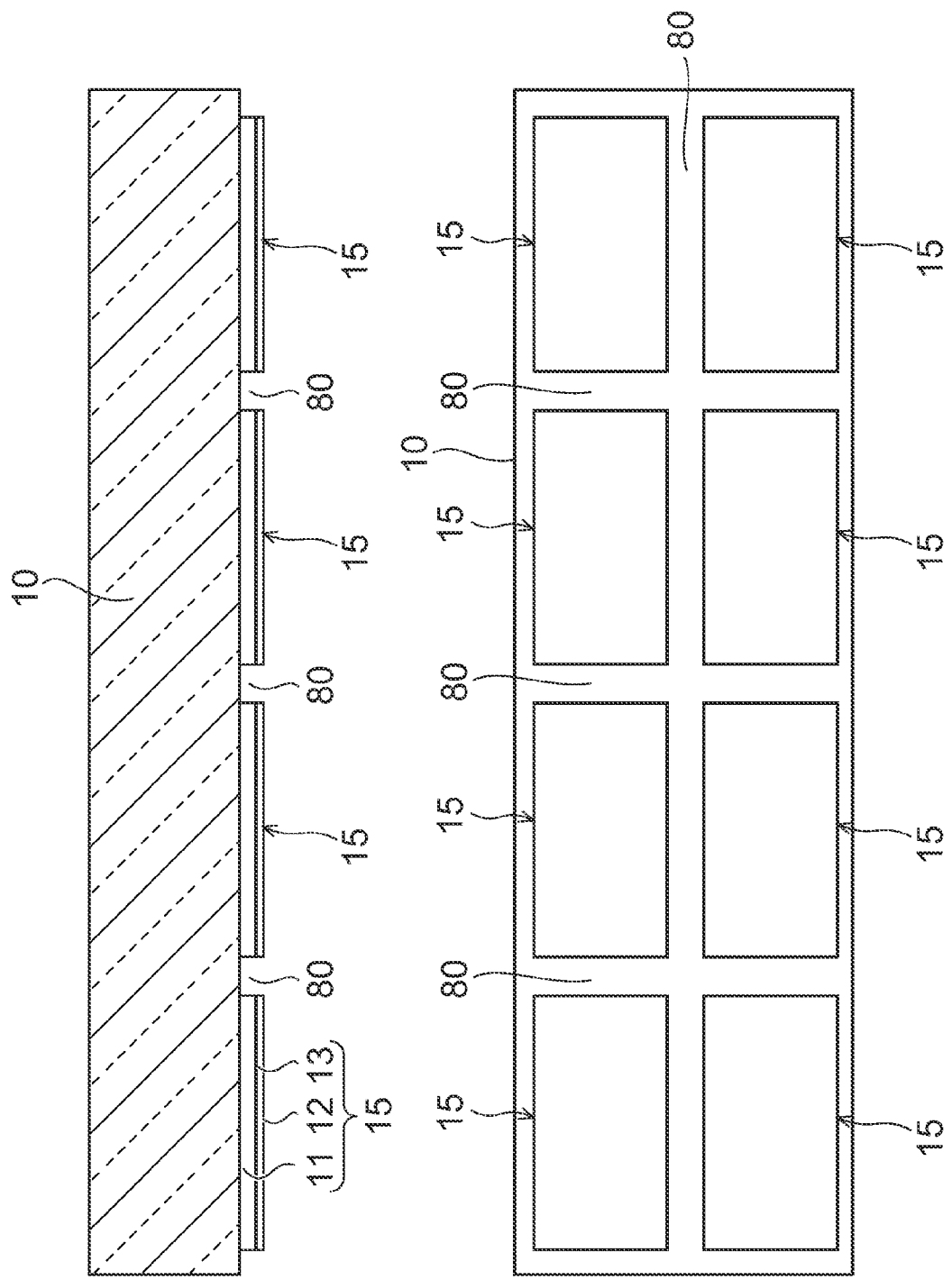

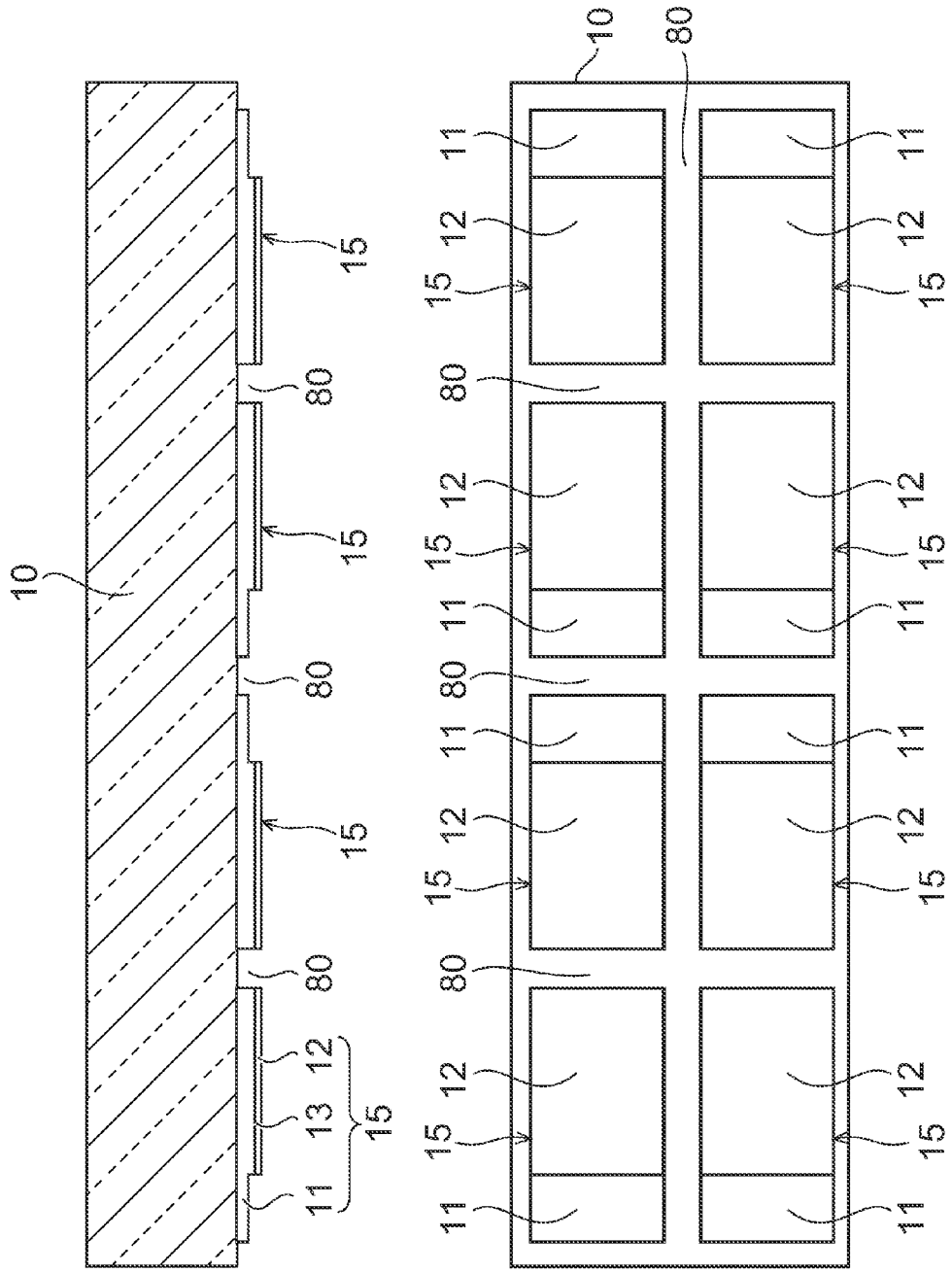

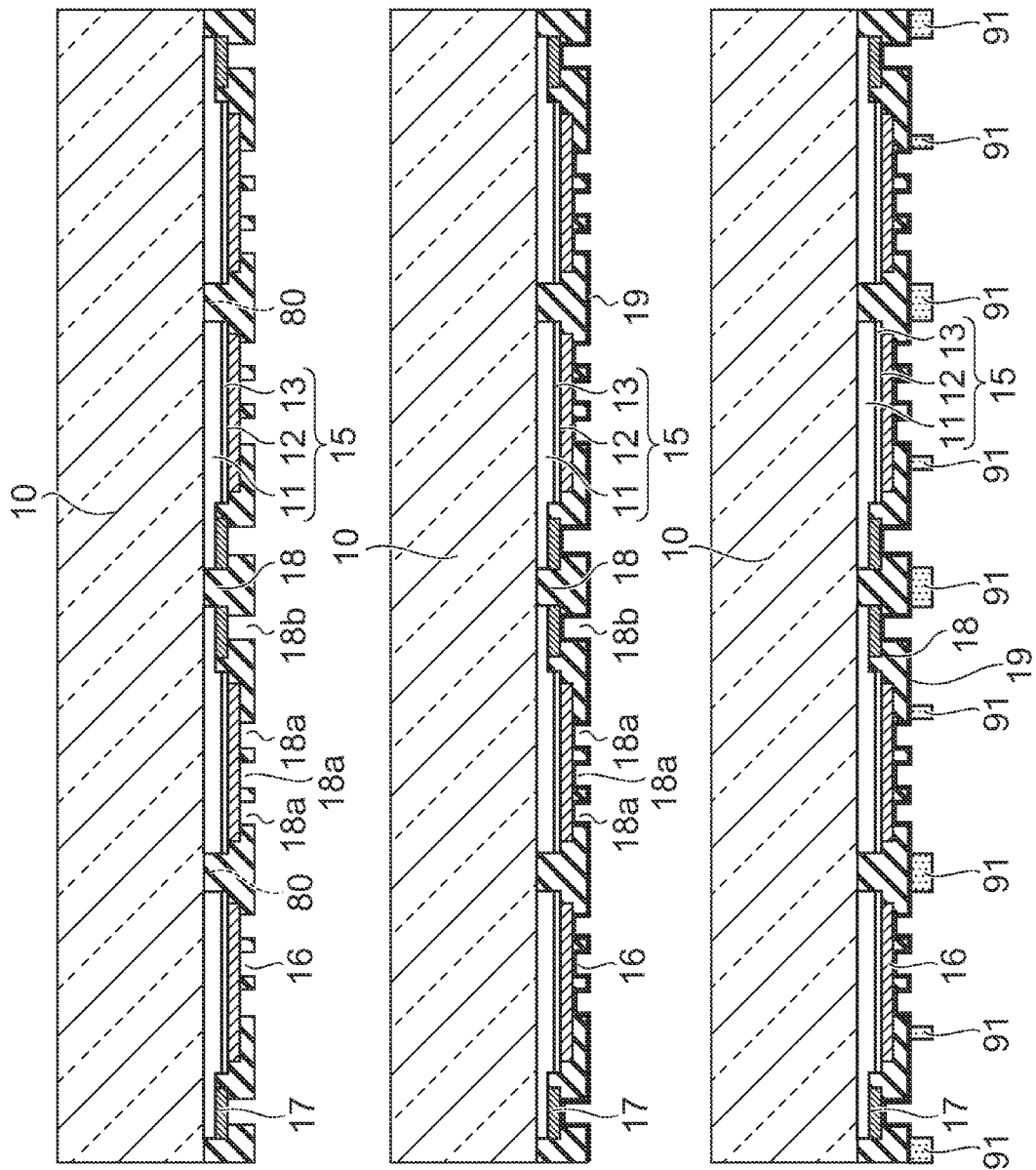

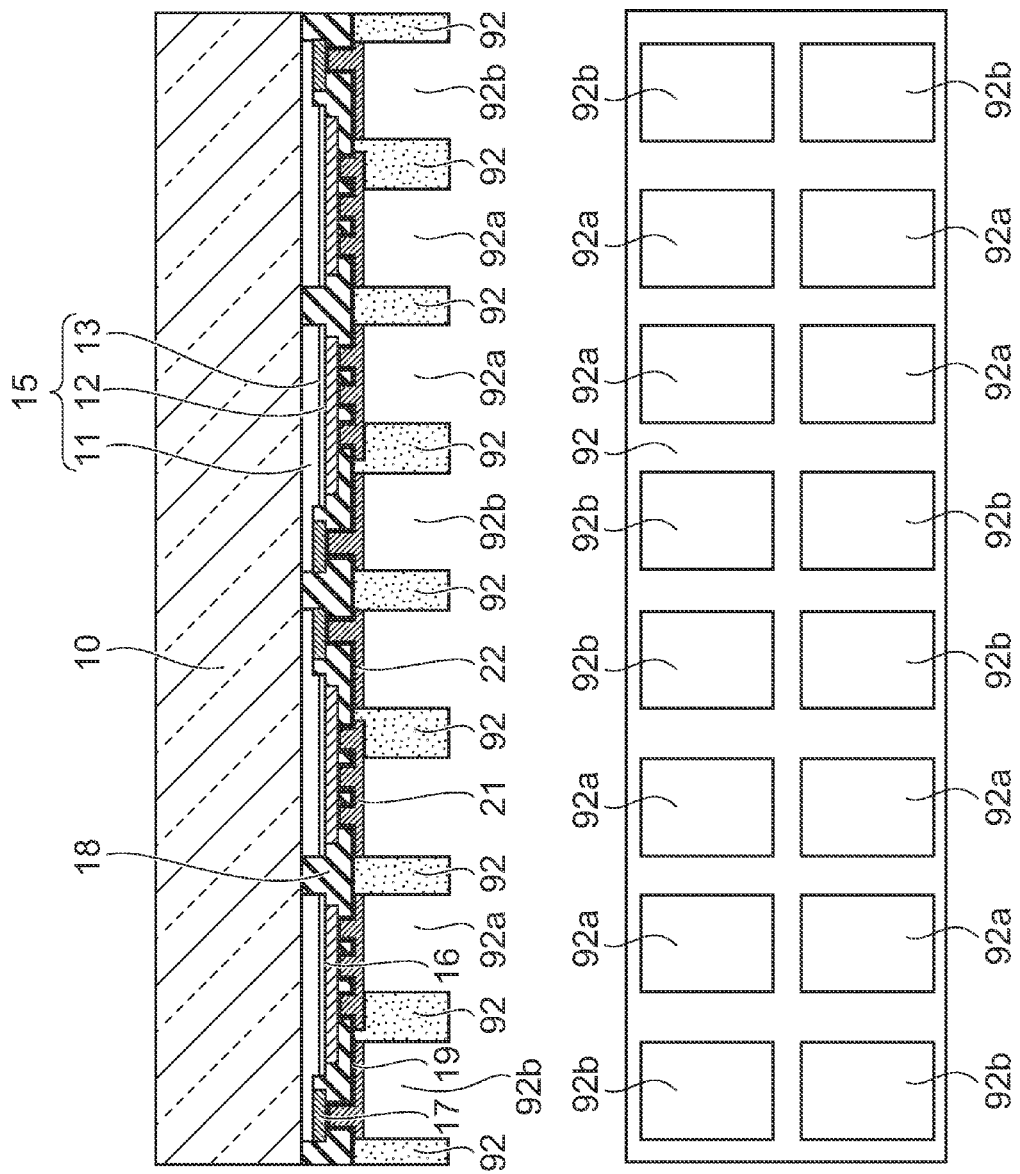

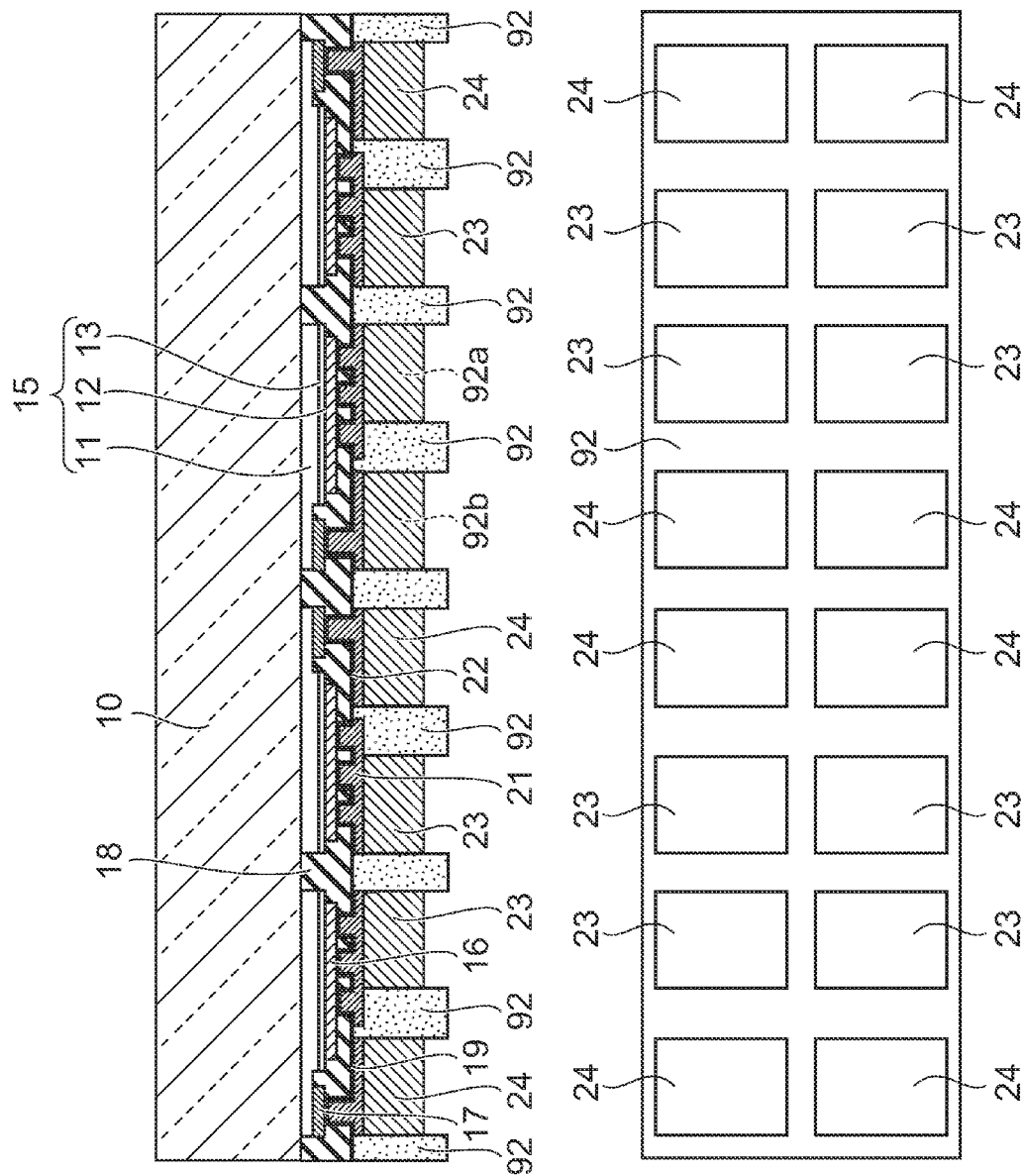

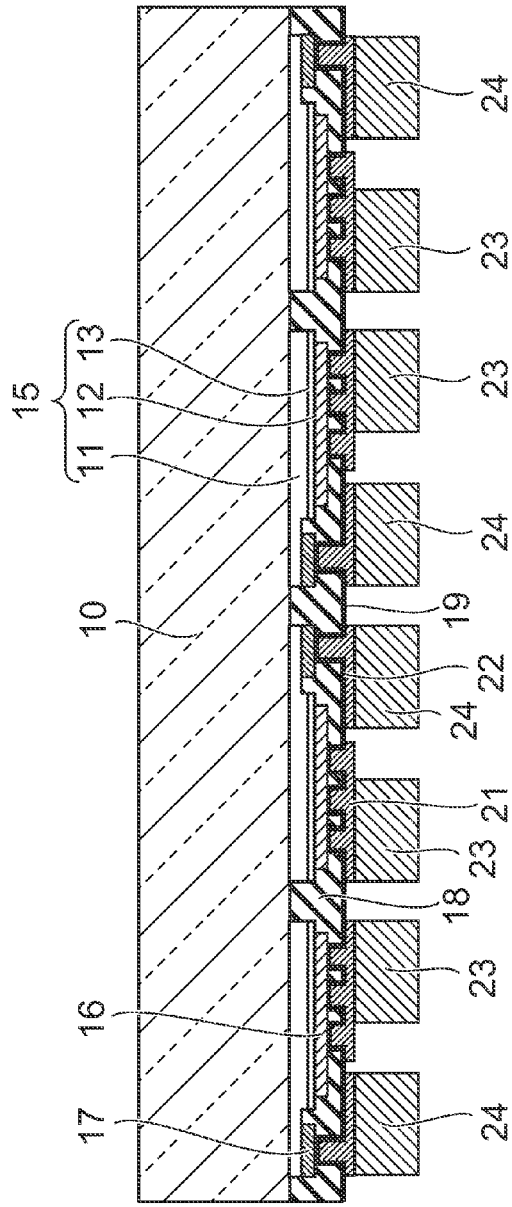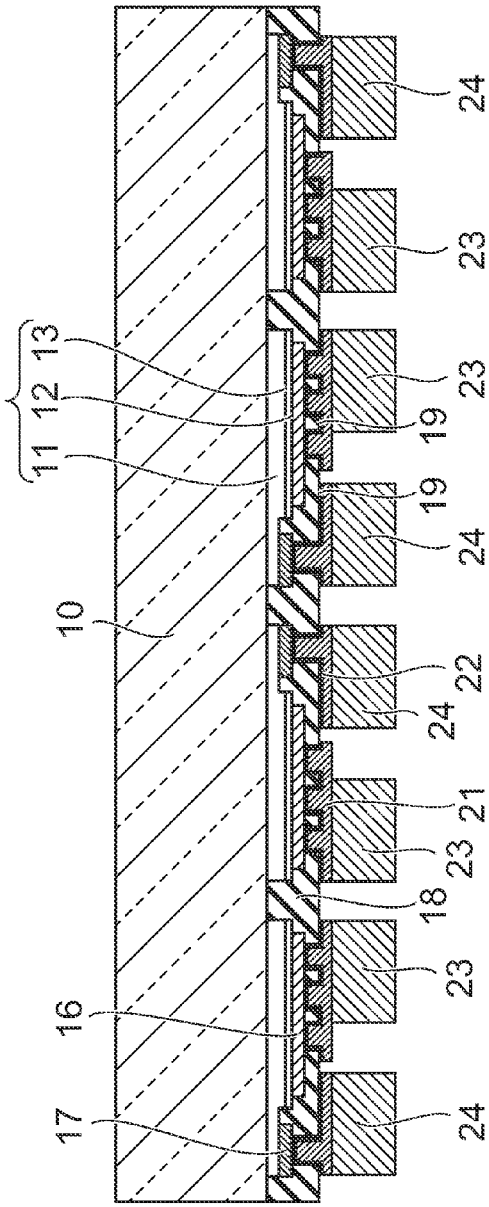

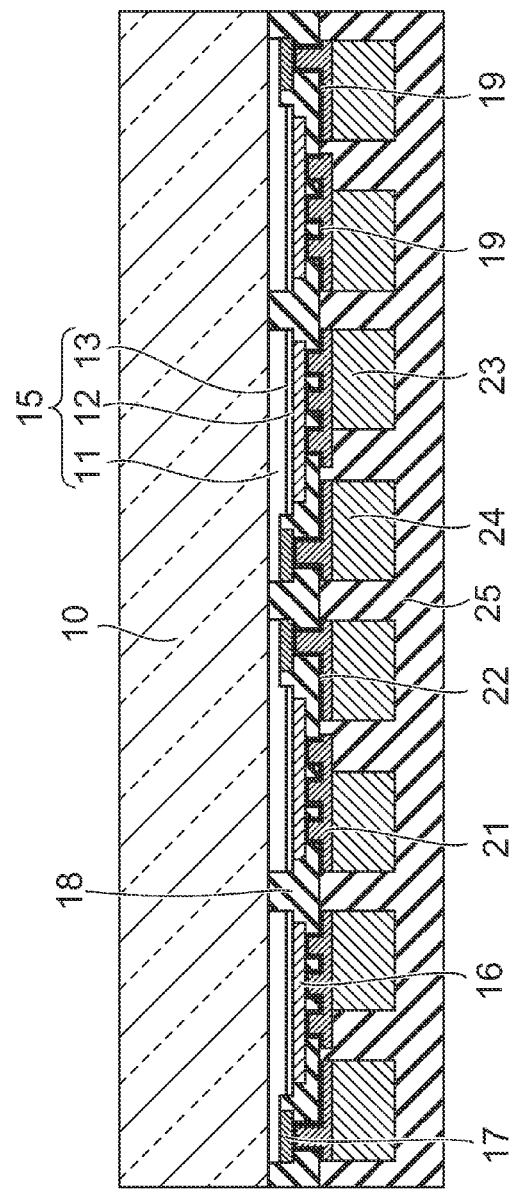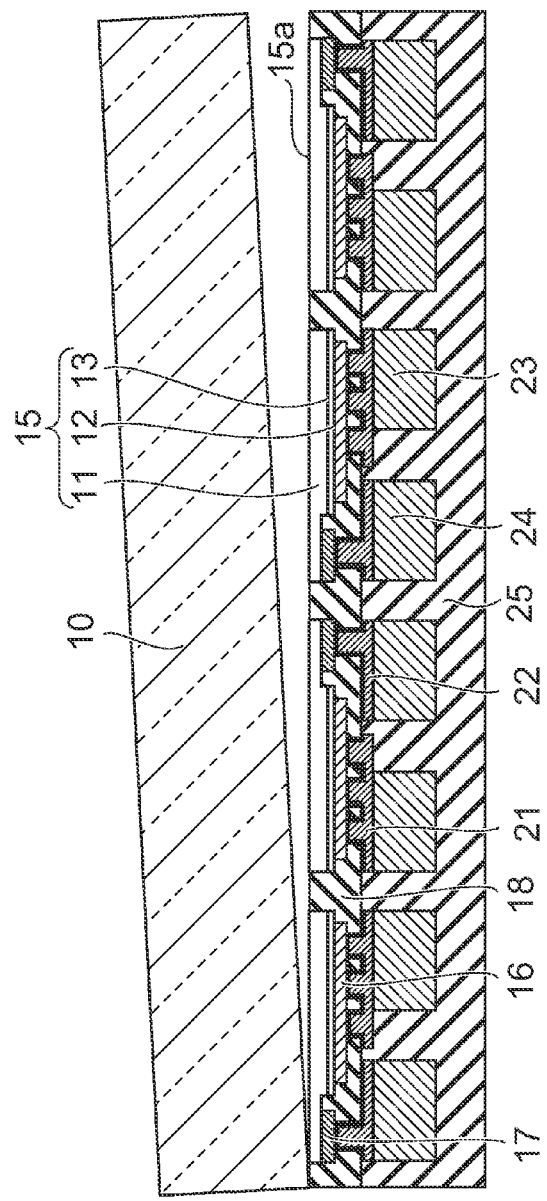

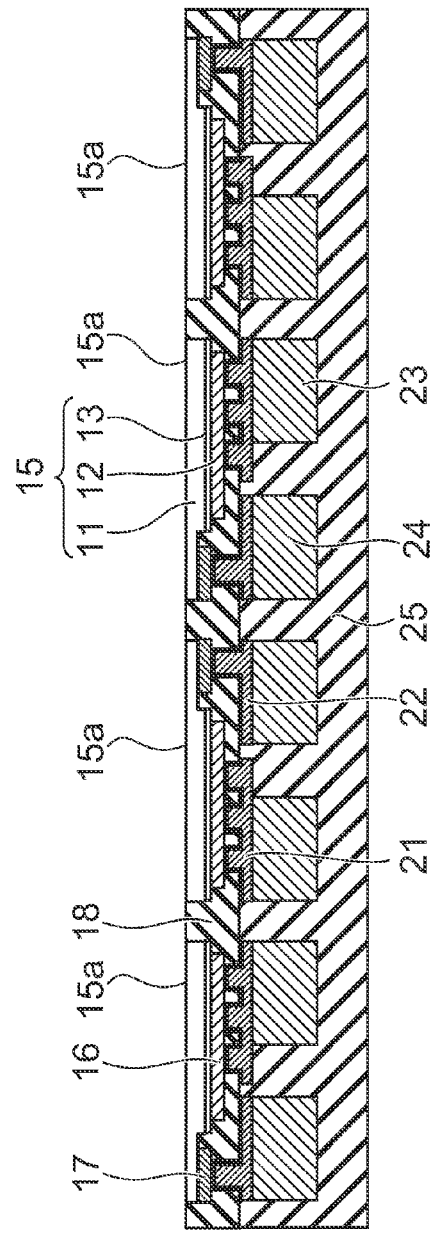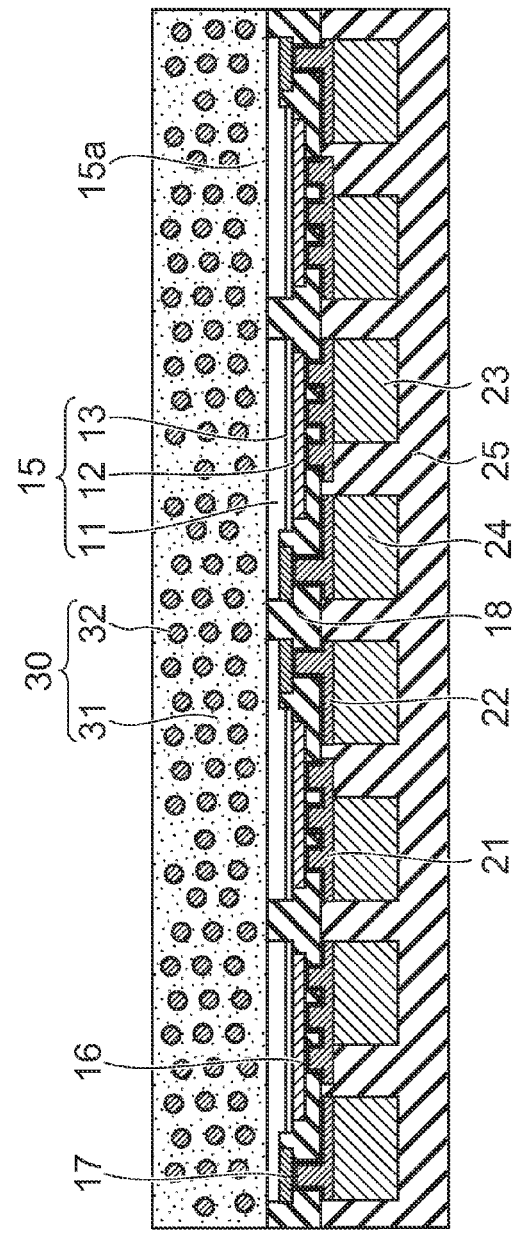
FIG. 12A
FIG. 12B

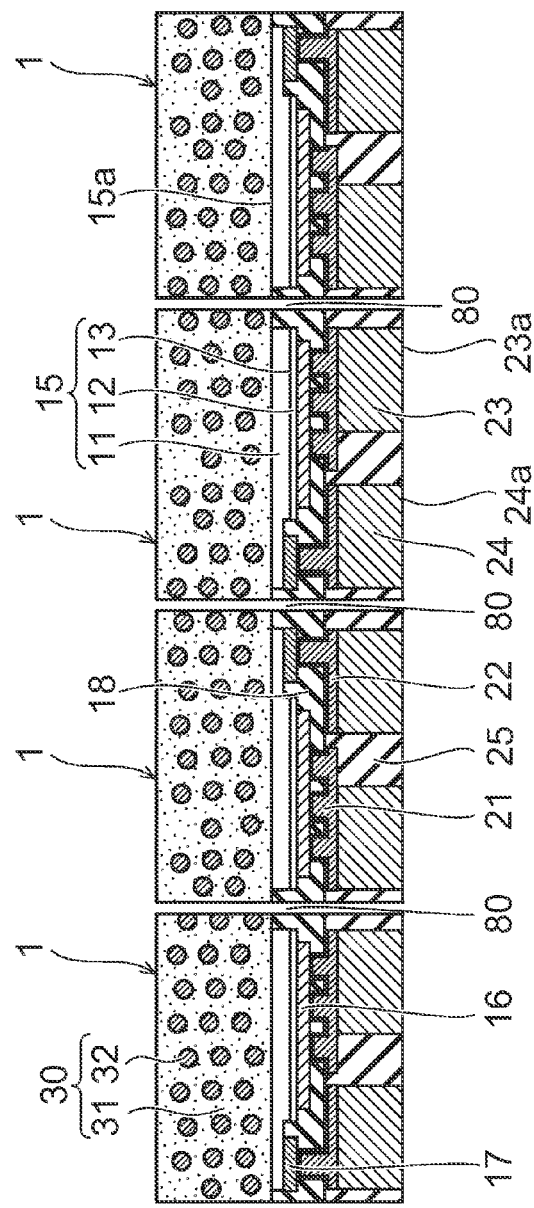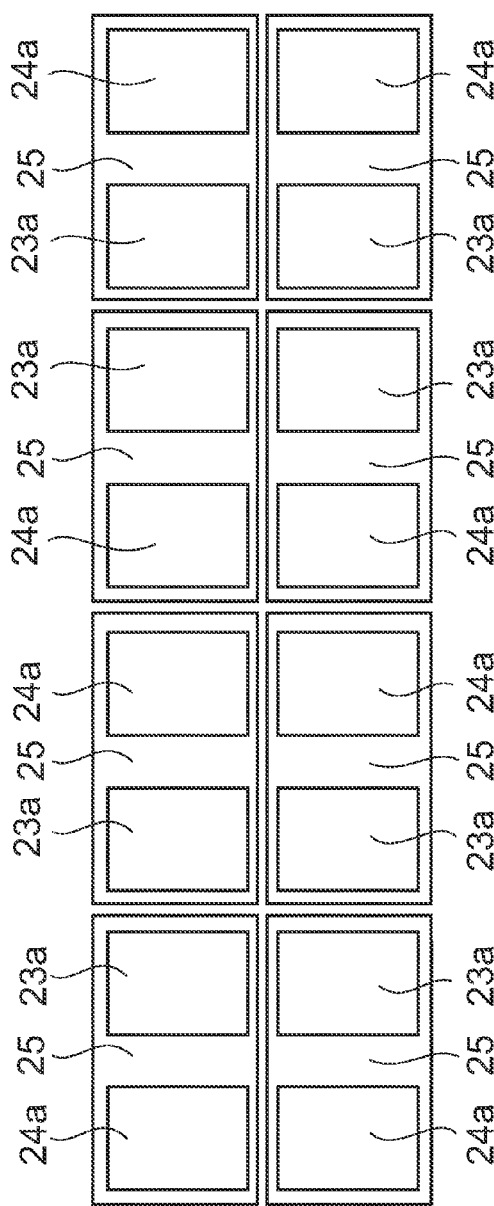
FIG. 13A
FIG. 13B

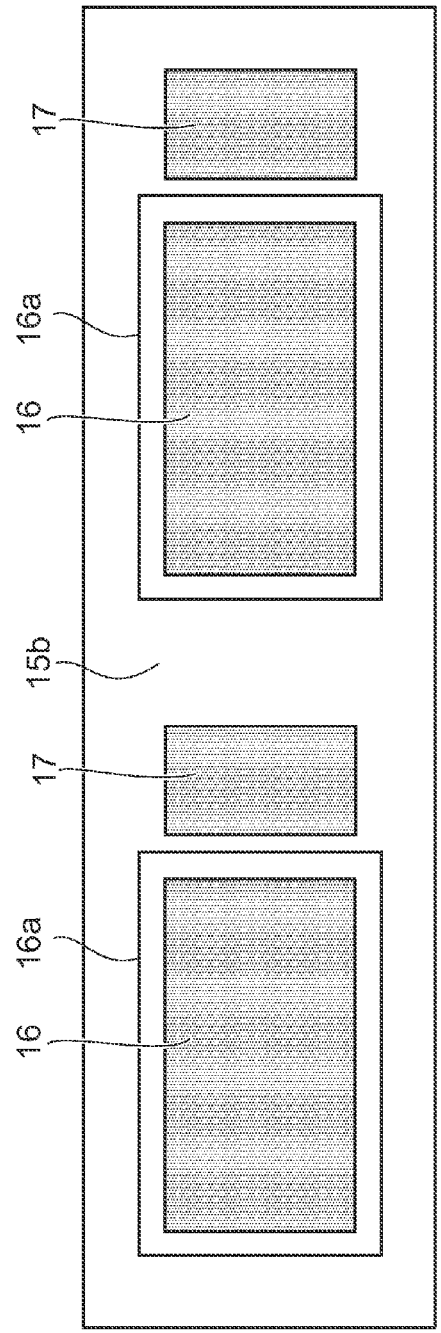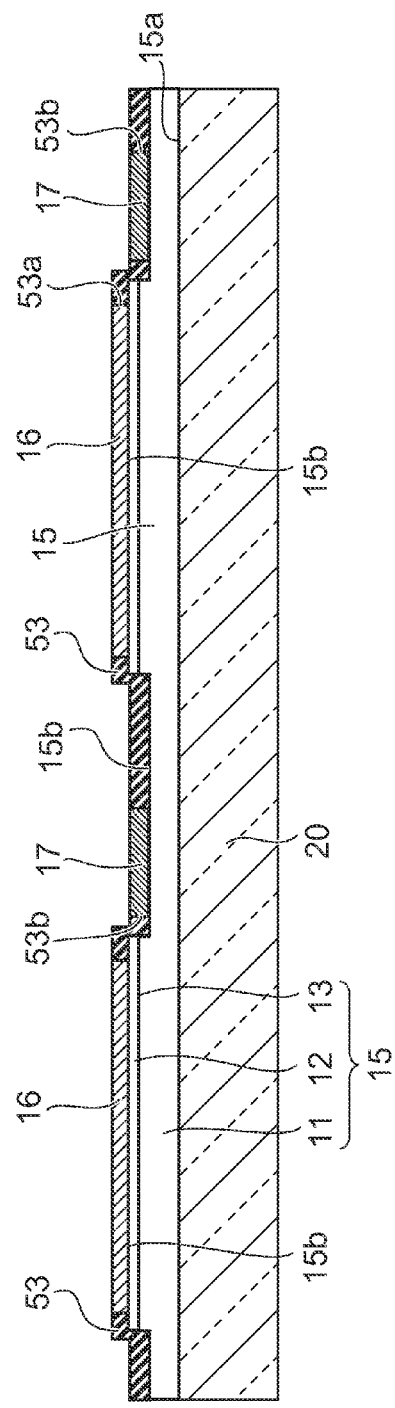

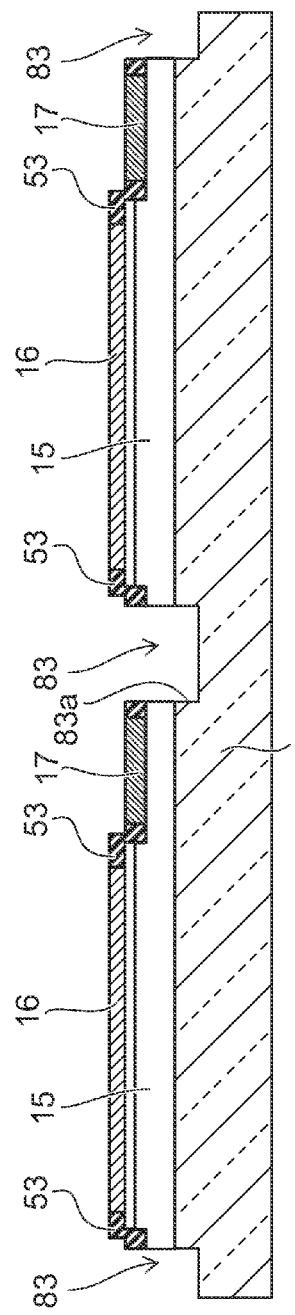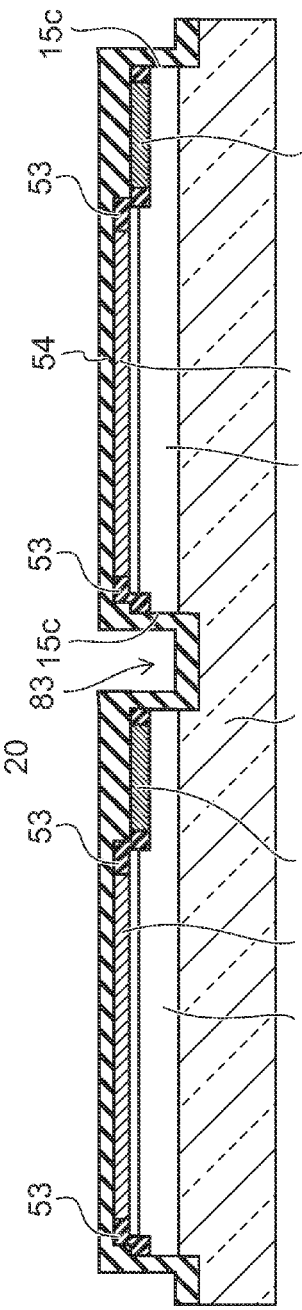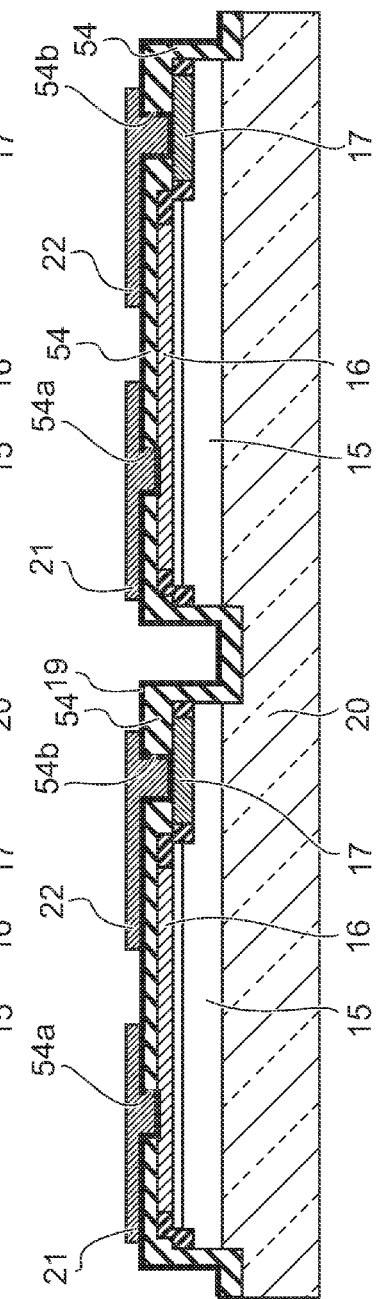

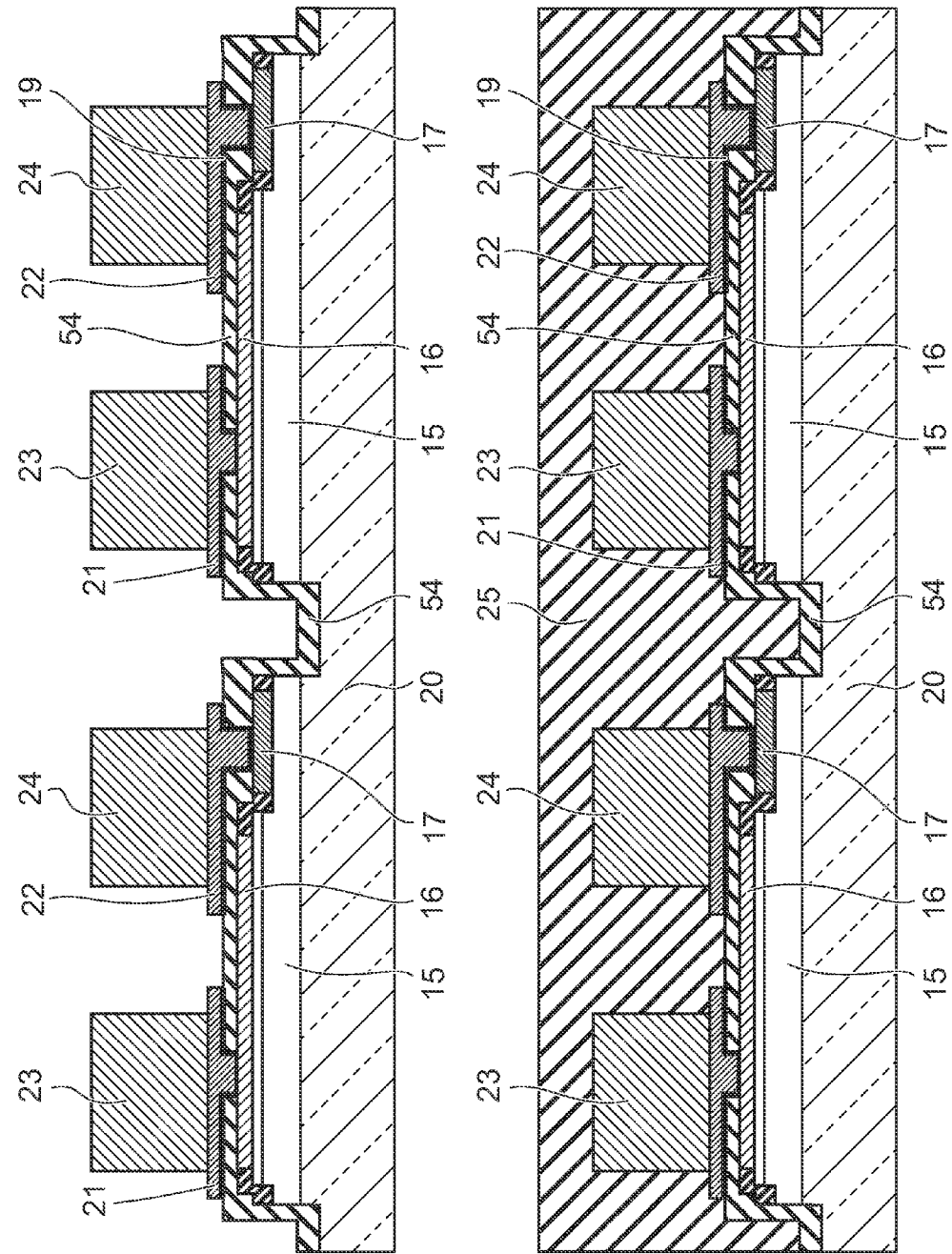

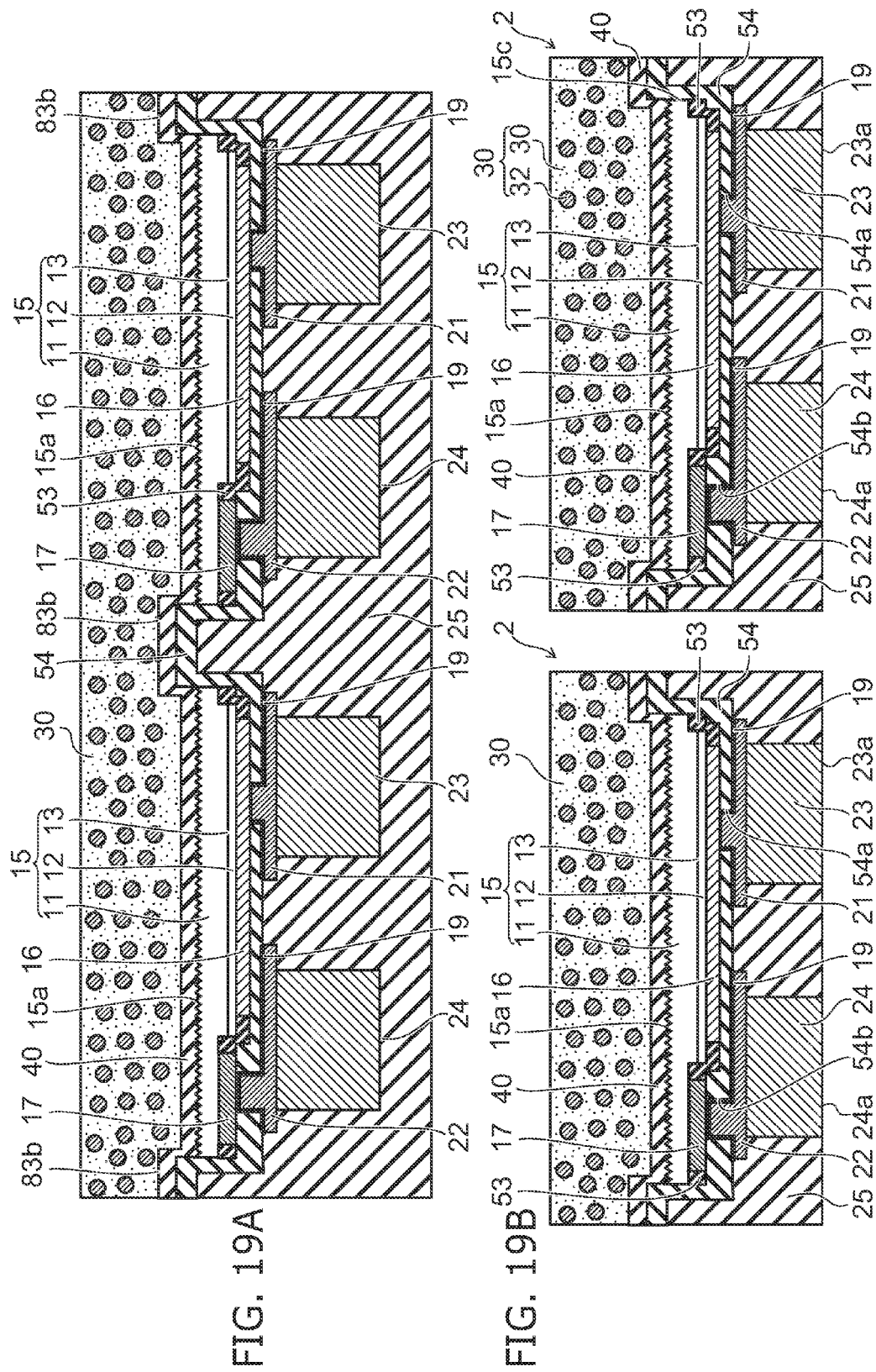

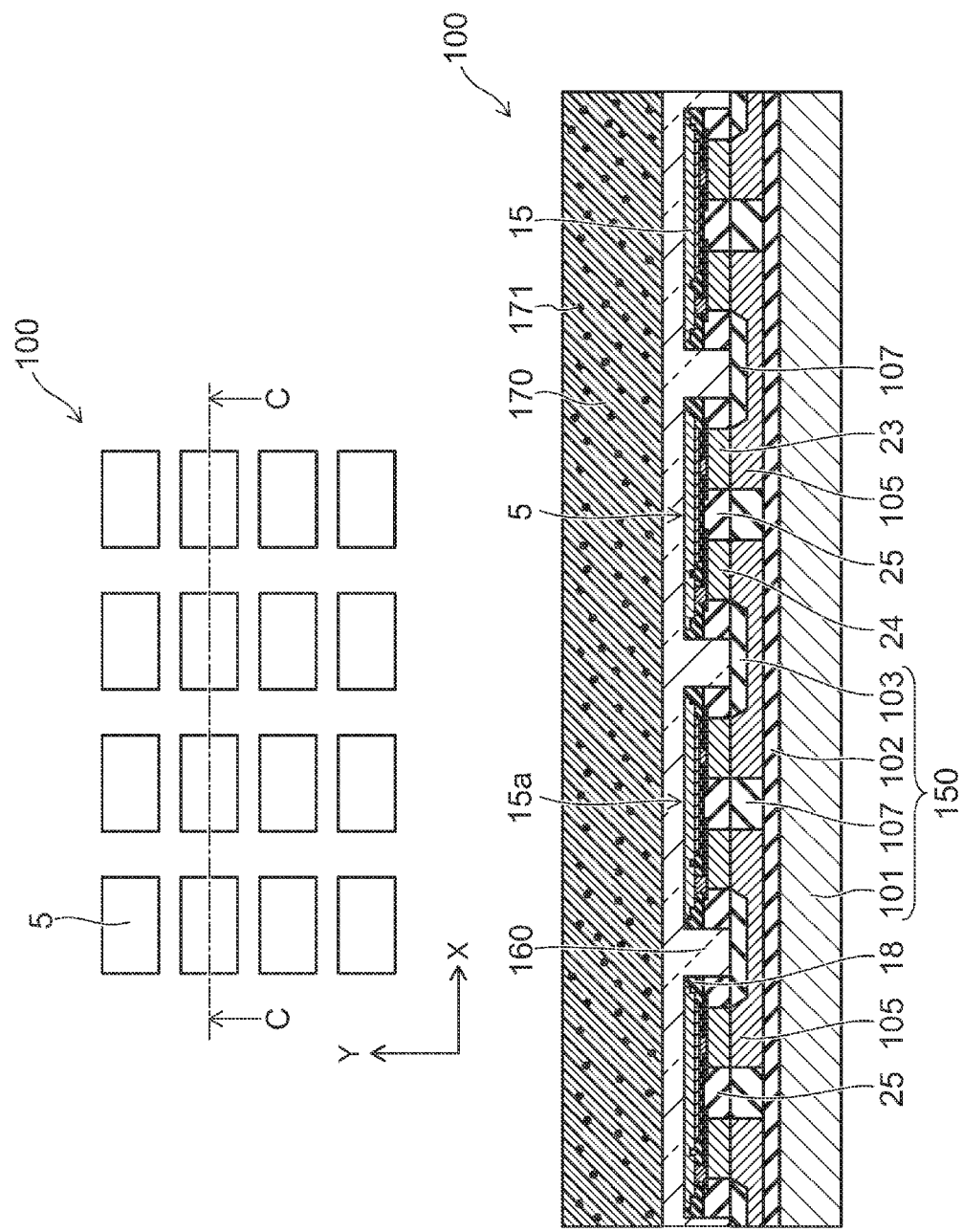

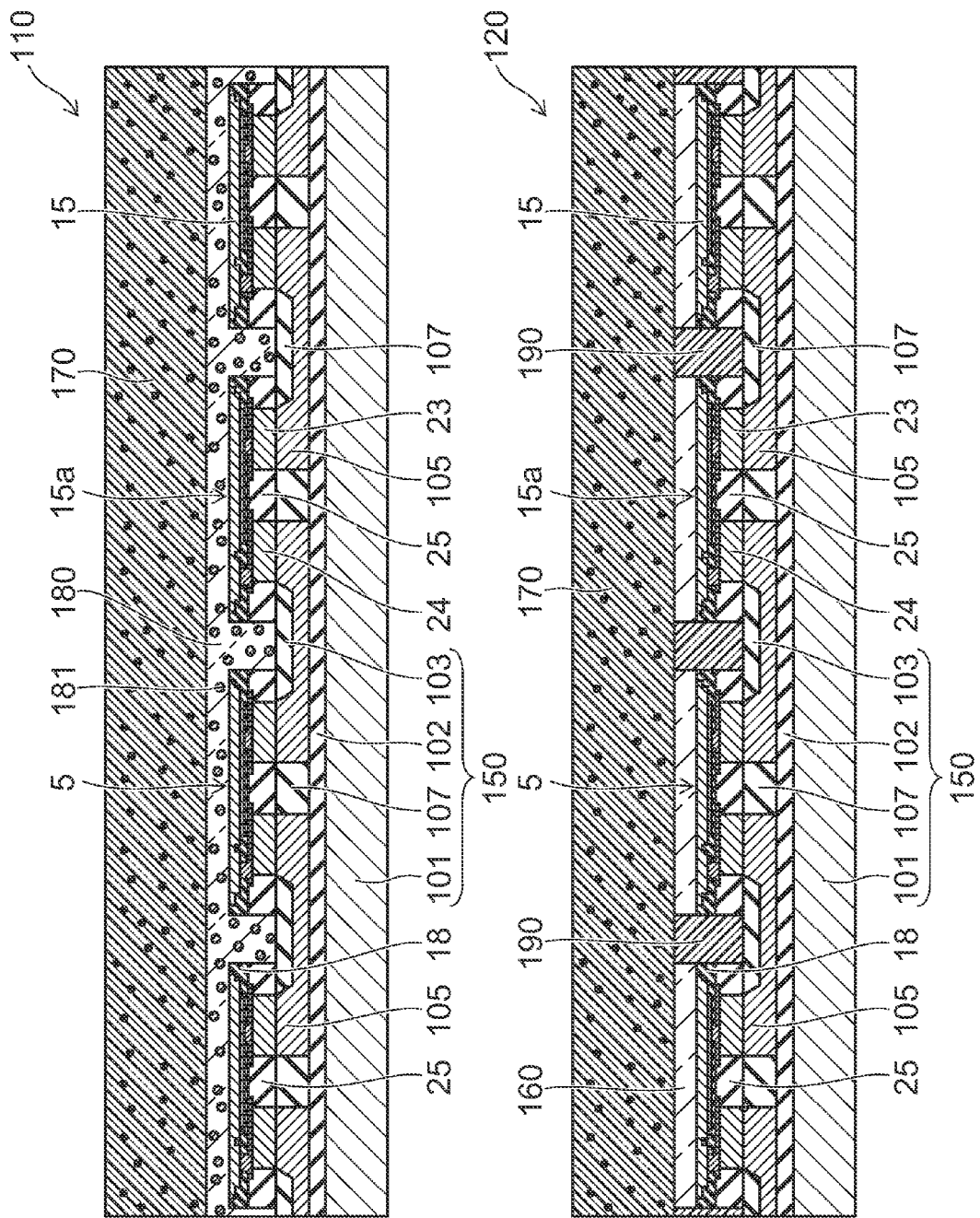

SEMICONDUCTOR LIGHT EMITTING DEVICE AND LIGHT SOURCE UNIT

CROSS-REFERENCE TO RELATED APPLICATIONS

This application is based upon and claims the benefit of priority from Japanese Patent Application No. 2012-120067, filed on May 25, 2012; the entire contents of which are incorporated herein by reference.

FIELD

Embodiments are related generally to a semiconductor light emitting device and a light source unit.

BACKGROUND

A semiconductor light emitting device is a light source of low power consumption and long lifetime, and is being used for various applications. The semiconductor light emitting device can be downsized, thereby being accommodated in a small chip size package. However, it becomes more difficult to control the light distribution of the semiconductor light emitting device as the package size becomes smaller.

BRIEF DESCRIPTION OF THE DRAWINGS

FIGS. 2A to 13B are schematic views illustrating a manufacturing process of the semiconductor device according to the first embodiment;

FIGS. 15A to 19B are schematic views illustrating a manufacturing process of the semiconductor device according to the second embodiment;

FIGS. 22A and 22B are schematic views illustrating a light source unit according to a fourth embodiment;

FIGS. 23A and 23B are schematic cross-sectional views illustrating light source units according to variations of the fourth embodiment;

DETAILED DESCRIPTION

Figure 1:
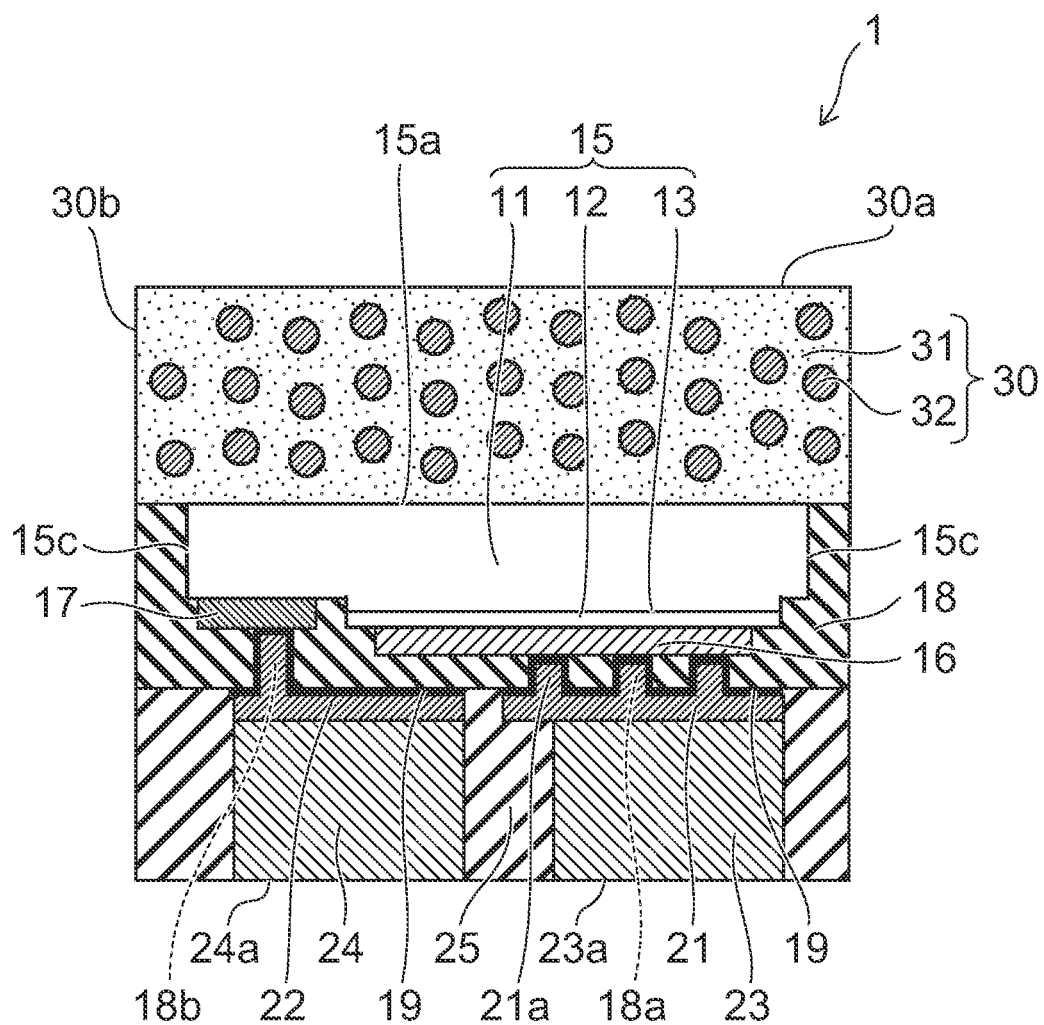
FIG. 1 is a schematic cross-sectional view illustrating a semiconductor light emitting device according to a first embodiment.

According to an embodiment, a semiconductor light emitting device includes a semiconductor layer, a p-side electrode, n-side electrode and a resin layer. The semiconductor layer has a first face and a second face opposite to the first face, and includes a light emitting layer. The p-side electrode is provided on the semiconductor layer on the second face side. The n-side electrode is provided on the semiconductor layer on the second face side. The resin layer is provided on the first face and transmits light emitted from the light emitting layer, the resin layer including a top surface opposite to the first face and four side faces provided along an outer edge of the first face and connected to the top surface, the resin layer including a scattering substance scattering the light emitted from the light emitting layer.

Embodiments will be described with reference to the drawings. Like reference numerals in the drawings denote like elements, and the descriptions of the like elements are appropriately omitted and the different elements are described.

First Embodiment

FIG. 1A is a schematic cross-sectional view of a semiconductor light emitting device 1 according to a first embodiment. The semiconductor light emitting device 1 includes a semiconductor layer 15 having a light emitting layer 13. The semiconductor layer 15 includes a first face 15a and a second face 15b opposite to the first face 15a (see FIG. 2A), and electrodes and interconnections are provided on the second face 15b side. The semiconductor layer 15 externally emits light from the first face 15a, which is emitted from the light emitting layer 13.

The semiconductor layer 15 includes a first semiconductor layer 11 and a second semiconductor layer 12. The first semiconductor layer 11 and the second semiconductor layer 12, for example, contain gallium nitride. The first semiconductor layer 11 may include an underlying buffer layer, an n-type GaN layer, and the like. The second semiconductor layer 12 includes a p-type GaN layer, a light emitting layer (active layer) 13, and the like. The light emitting layer 13 may include a material that emits blue light, purple light, blue-purple light, ultraviolet light, or the like. The semiconductor layer 15 includes a first portion including the light emitting layer 13, and a second portion not including the light emitting layer 13.

The semiconductor light emitting device 1 further includes a resin layer provided on the first face 15a (hereinafter referred to as a transparent resin layer 30). The transparent resin layer 30 includes a transparent resin 31 that transmits light emitted from the light emitting layer 13 and a scattering substance 32 dispersed in the transparent resin 31. The scattering substance 32 is a fine particle having a refractive index different from the refractive index of the transparent resin 31. The grain size of the scattering substance 32 is smaller than the wavelength of light emitted from the light emitting layer 13.

It is noted that "being transparent" referred here is not limited to transmitting all the light emitted from the light emitting layer 13. The transparent resin 31 may partially absorb light emitted from the light emitting layer 13. "The grain size" is the average grain size, and can be measured with the scanning electron microscope, for example. Next, the structure of the semiconductor light emitting device 1 will be described in detail with reference to FIG. 1.

As shown in FIG. 1, the semiconductor layer 15 has a portion including the light emitting layer 13, and a portion not including the light emitting layer 13. The area of the portion including the light emitting layer 13 is provided wider than the area of the portion not including the light emitting layer 13.

Namely, the second face 15b of the semiconductor layer 15 is processed in a concavo-convex shape. The convex portion includes the light emitting layer 13, and a p-side electrode 16 is provided on the surface of the second semiconductor layer 12, which is the surface of the convex portion. In other words, the p-side electrode 16 is provided on the second face 15b in the portion including the light emitting layer 13.

On the second face 15b of the semiconductor layer 15, the portion not including the light emitting layer 13 is provided side by side with the convex portion. An n-side electrode 17 is provided on the first semiconductor layer 11 in the portion not including the light emitting layer 13. Namely, the n-side electrode 17 is provided on the second face 15b of the portion not including the light emitting layer 13.

A first insulating film (hereinafter referred to as an insulating film 18) is provided on the second face side of the semiconductor layer 15. The insulating film 18 covers the semiconductor layer 15, the p-side electrode 16, and the n-side electrode 17. In addition, the insulating film 18 covers the side surfaces of the light emitting layer 13 and the second semiconductor layer 12 for the protection thereof.

It is noted that in the specification, "covering" is not limited to the case where a component covering an element directly contacts the element being covered. "Covering" also includes the case where a component covering an element contacts the element being covered via a different component.

In addition, another insulating film (for example, a silicon oxide film) may be provided between the insulating film 18 and the semiconductor layer 15. The insulating film 18, for example, is formed of a resin, such as polyimide that is superior for the patterning of fine openings. Alternatively, an inorganic film such as a silicon oxide film or a silicon nitride film may be used as the material of the insulating film 18. The insulating film 18 covers a side face 15c provided between the first face 15b and the second face. The insulating film 18 does not cover the first face 15a.

A p-side interconnection layer 21 and an n-side interconnection layer 22 are provided on a face of the insulating film 18 opposite to the second face of the semiconductor layer 15, so as to be separated from each other.

Parts of the p-side interconnection layer 21 are provided in a plurality of first openings 18a that are formed in the insulating film 18 up to the p-side electrodes 16, and the p-side interconnection layer 21 is electrically connected to the p-side electrodes 16 via the parts provided in the first openings 18a. A part of the n-side interconnection layer 22 is also provided in a second opening 18b that is formed in the insulating film 18 up to the n-side electrodes 17, and the n-side interconnection layer 22 is electrically connected to the n-side electrodes 17.

A p-side metal pillar 23 is provided on a face of the p-side interconnection layer 21 opposite to the p-side electrode 16. Then, a p-side interconnection includes the p-side interconnection layer 21, the p-side metal pillar 23, and a metal film 19 that serves as a seed layer, as described later.

It should be noted that the metal film 19 might be undistinguishable, when the same material as the p-side interconnection layer 21 and the n-side interconnection layer 22 is used, and the metal film 19 and each interconnection layer are joined into one body. The metal film 19 may not be provided in the case where the p-side interconnection layer 21 and the n-side interconnection layer 22 are formed by a method other than the plating method.

An n-side metal pillar 24 is provided on a face of the n-side interconnection layer 22 opposite to the n-side electrodes 17. Then, an n-side interconnection includes the n-side interconnection layer 22, the n-side metal pillar 24, and the metal film 19.

An insulating film 25 serving as a second insulating film is stacked on the insulating film 18. The insulating film 25 covers the periphery of the p-side interconnection and the periphery of the n-side interconnection. For example, the side surfaces of the p-side metal pillar 23 and the n-side metal pillar 24 are covered with the insulating film 25.

A face of the p-side metal pillar 23 opposite to the p-side interconnection layer 21 is exposed from the insulating film 25 and serves as a p-side external terminal 23a. A face of the n-side metal pillar 24 opposite to the n-side interconnection layer 22 is exposed from the insulating film 25 and serves as an n-side external terminal 24a. The p-side external terminal 23a and the n-side external terminal 24a are exposed from the same face of the insulating film 25 (the lower surface in FIG. 1). The p-side external terminal 23a and the n-side external terminal 24a are bonded to a pad formed in a mounting substrate through a bonding member such as a solder, other metal, a material having conductivity, or the like.

A distance between the p-side external terminal 23a and the n-side external terminal 24a is longer than a distance between the p-side interconnection layer 21 and the n-side interconnection layer 22 on the insulating film 18. The p-side external terminal 23a and the n-side external terminal 24a are separated from each other with such a distance, so that the external terminals do not form a short circuit via solder or the like at the time of being mounted on the mounting substrate.

On the other hand, the p-side interconnection layer 21 may approach the n-side interconnection layer 22 up to a process limit. Accordingly, it is possible to make the area of the p-side interconnection layer 21 wider, and thereby, the contact area can be enlarged between the p-side interconnection layer 21 and the p-side electrode 16. Then it becomes possible to reduce a current density in the p-side interconnection, and to improve the heat dissipation.

Furthermore, the area of the p-side interconnection layer 21 that is in contact with the p-side electrodes 16 through the plurality of first openings 18a is larger than the area of the n-side interconnection layer 22 that is in contact with the n-side electrodes 17 through the second openings 18b. Thereby, the current density injected into the light emitting layer can be reduced, and the current distribution in the light emitting layer 13 becomes uniform. In addition, the heat dissipation from the light emitting layer 13 through the p-side interconnection can be improved.

A high optical output can be acquired, since the light emitting layer 13 is formed over the first region that is larger than the second region on which the n-side electrode 17 is provided. In addition, the n-side interconnection layer 22 having a larger area than the n-side electrode 17 can be provided on the mounting face side. Accordingly, in the n-side interconnection layer 22, the portion extending on the insulating film 18 can be formed to have larger area than the contact portion that is in contact with the n-side electrodes 17.

The first semiconductor layer 11 is electrically connected to the n-side metal pillar 24 having the n-side external terminal 24a through the n-side electrode 17, the metal film 19, and the n-side interconnection layer 22. The second semiconductor layer 12 including the light emitting layer 13 is electrically connected to the p-side metal pillar 23 having the p-side external terminal 23a through the p-side electrode 16, the metal film 19, and the p-side interconnection layer 21.

The p-side metal pillar 23 is thicker than the p-side interconnection layer 21, and the n-side metal pillar 24 is thicker than the n-side interconnection layer 22. Each thickness of the p-side metal pillar 23, the n-side metal pillar 24, and the insulating film 25 is larger than that of the semiconductor layer 15. Here, the "thickness" represents a thickness in the vertical direction in FIG. 1.

In addition, each thickness of the p-side metal pillar 23 and the n-side metal pillar 24 is larger than that of a stacked body that includes the semiconductor layer 15, the p-side electrode 16, the n-side electrode 17, and the insulating film 18. In addition, the aspect ratio (the ratio of the thickness to the planar size) of each one of the metal pillars 23 and 24 is not limited to be one or more, and the ratio may be less than one. In other words, each thickness of the metal pillars 23 and 24 may be smaller than the planar size of the metal pillars 23 and 24.

According to the embodiment, even though a substrate 10 used for forming the semiconductor layer 15 is removed as described later, the mechanical strength of the semiconductor light emitting device 1 can be maintained, since the semiconductor layer 15 is stably supported by the p-side metal pillar 23, the n-side metal pillar 24, and the insulating film 25.

Copper, gold, nickel, silver, and the like can be used as the materials of the p-side interconnection layer 21, the n-side interconnection layer 22, the p-side metal pillar 23, and the n-side metal pillar 24. Among these materials, copper is superior to the other materials in thermal conductivity, resistance for migration, and adhesiveness to the insulating films 18 and 25.

The insulating film 25 reinforces the p-side metal pillar 23 and the n-side metal pillar 24. It is preferable that the thermal expansion coefficient of the insulating film 25 is the same as or closes to the thermal expansion coefficient of the mounting substrate. As examples of such an insulating film 25, there are an epoxy resin, a silicone resin, a fluorine resin, and the like.

In addition, when the semiconductor light emitting device 1 is mounted on the mounting substrate through the p-side external terminal 23a and the n-side external terminal 24a, the stress applied to the semiconductor layer 15 through soldering or the like can be absorbed and relieved by the p-side metal pillar 23 and the n-side metal pillar 24.

The p-side interconnection that includes the p-side interconnection layer 21 and the p-side metal pillar 23 is connected to the p-side electrode 16 through a plurality of vias 21a that are provided inside the plurality of first openings 18a and are separated from each other. Accordingly, the p-side interconnection may make stress relieving more effective.

Alternatively, the p-side interconnection layer 21 may be connected to the p-side electrode 16 through a post that is larger in the planar size than the via 21a. In such a case, the heat dissipation of the light emitting layer 13 can be improved through the p-side electrode 16, the p-side interconnection layer 21, and the p-side metal pillar 23, all of which are formed of metal.

As described later, the substrate 10 used for a crystal growth of the semiconductor layer 15 is removed from the first face 15a. Accordingly, the semiconductor light emitting device 100 can be formed with lower height.

A fine concavo-convex is formed on the first face 15a of the semiconductor layer 15 using we etching (frost process), where an alkali-based solution is applied to the first face 15a. The light emitted from the light emitting layer 13 can be extracted outside through the first face 15a, suppressing light reflection at various incident angles by providing the concavo-convex on the first face 15a.

A fluorescent substance layer 30 is provided on the first face 15a. The fluorescent substance layer 30 includes a transparent resin 31 and a plurality of fluorescent substances 32 dispersed in the transparent resin 31. The transparent resin 31 has transparency for the lights emitted from the light emitting layer 13 and the fluorescent substance 32. For example, a silicone resin, an acrylic resin, a phenyl resin, or the like may be used as the transparent resin 31.

For the scattering substance 32, a fine particle such as silica and titanium oxide can be used, for example.

Light emitted from the light emitting layer 13 is scattered in the transparent resin layer 30 with the scattering substance 32. Since the grain size of the scattering substance 32 is smaller than the peak wavelength of light emitted from the light emitting layer 13, the emitted light is scattered in Rayleigh's model, and distributed isotropically.

The transparent resin layer 30 includes a top surface 30a opposite to the first face 15a and four side faces 30b connected to the top surface. The four side faces 30b are provided by cutting together with the insulating films 18 and 25 along the outer edge of the semiconductor layer 15. Light emitted from the light emitting layer 13 is scattered by the scattering substance 32, and externally emitted from the top surface 30a and the four side faces 30b. Namely, the transparent resin layer 30 including the scattering substance 32 can widen the distribution of light emitted from the light emitting layer 13.

For example, the semiconductor light emitting device exhibits the light distribution in which the luminance in the upward direction perpendicular to the light emitting face becomes higher and the luminance in the lateral direction along the light emitting face is relatively lower as the package size becomes smaller. In the embodiment, the first face 15a serves as the light emitting face, and the transparent resin layer 30 provided thereon with the scattering substance 32 makes the luminance in the lateral direction higher. Hence, the characteristics of wide light distribution can be implemented at low costs in a small chip size package.

Next, a method of manufacturing the semiconductor light emitting device 1 according to the embodiment will be described with reference to FIGS. 2A to 15B. FIGS. 2A to 13B show partial areas of a wafer.

FIG. 2A is a schematic cross-sectional view of the semiconductor layer 15. The semiconductor layer 15 is a stacked body including a first semiconductor layer 11 and a second semiconductor layer 12, and formed on a major face (the lower face in FIG. 2A) of a substrate 10. FIG. 2B is a schematic view corresponding to a lower face in FIG. 2A.

The first semiconductor layer 11 is formed on the major face of the substrate 10, and the second semiconductor layer 12 including a light emitting layer 13 is formed thereon. For example, the first semiconductor layer 11 and the second semiconductor layer 12 may contain gallium nitride, and grown on a sapphire substrate by using a metal organic chemical vapor deposition (MOCVD) method. Alternatively, a silicon substrate may be used as the substrate 10.

A first face 15a of the semiconductor layer 15 is a face through which the first semiconductor layer 11 is in contact with the substrate 10, and a second face 15b of the semiconductor layer 15 is the surface of the second semiconductor layer 12 opposite to the first semiconductor layer 11, as shown in FIG. 2.

Next, as shown in FIG. 3A, a groove 80 is formed passing through the semiconductor layer 15 and reaching the substrate 10, for example, by using a reactive ion etching (RIE) method using a resist mask (not shown). As shown FIG. 3B corresponding to the lower face of FIG. 3A, the groove 80 is formed, for example, in a lattice pattern on the substrate 10, and separates the semiconductor layer 15 into a plurality of chips on the substrate 10.

Alternatively, the process for separating the semiconductor layer 15 into multiple parts may be performed after selectively removing the second semiconductor layer 12, or after forming the p-side electrode 16 and the n-side electrode.

Next, as shown in FIG. 4A and FIG. 4B corresponding to the lower face of FIG. 4A, parts of the second semiconductor layer 12 are removed so as to expose parts of the first semiconductor layer 11, for example, by using the RIE method using a resist mask (not shown).

Each portion in which the first semiconductor layer 11 is exposed does not include the light emitting layer 13 as shown in FIG. 4A. An area of the second semiconductor layer 12 that includes the light emitting layer 13 is wider than an area of the portion not including the light emitting layer 13, where the first semiconductor layer 11 is exposed, as shown in FIG. 4B.

Figures 5A, 5B:
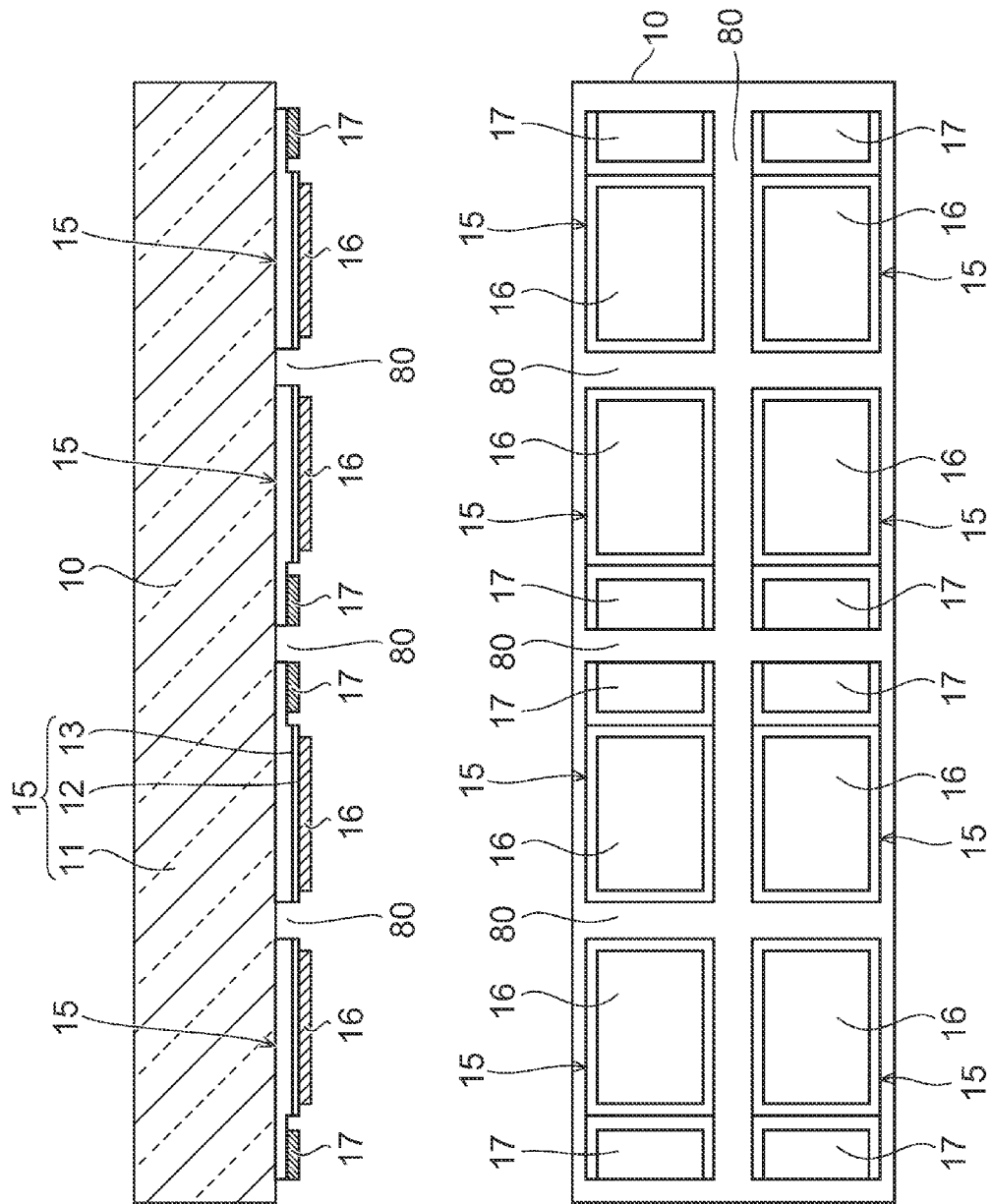

Next, as shown in FIG. 5A and FIG. 5B corresponding to the lower face of FIG. 5A, p-side electrodes 16 and n-side electrodes 17 are formed on the second face of the semiconductor layer 15. The p-side electrodes 16 are formed on the surfaces of the second semiconductor layer 12. The n-side electrodes 17 are formed on the exposed surfaces of the first semiconductor layer 11.

The p-side electrodes 16 and the n-side electrodes 17, for example, are formed using a sputtering method, a vapor deposition method, or the like. Either the p-side electrodes 16 or the n-side electrodes 17 may be formed first, or the p-side electrode 16 and n-side electrodes 17 may be simultaneously formed and inevitably made of the same material.

The p-side electrode 16 has preferably formed so as to reflect the light emitted from the light emitting layer 13. Hence, the p-side electrode 16 may include silver, silver alloy, aluminum, aluminum alloy, and the like. In addition, the p-side electrode 16 may include a metal protective film (barrier metal) formed on the reflection electrode, in order to prevent the reflection electrode from the sulfurization and the oxidization.

The area of the p-side electrode 16 provided in the portion including the light emitting layer 13 is wider than the area of the n-side electrode 17 provided in the portion not including the light emitting layer 13. Accordingly, a wide light emitting portion can be obtained. It is noted that the layout of the p-side electrode 16 and the n-side electrode 17 shown in FIG. 5B is one example, and the embodiment is not limited thereto.

In addition, a silicon nitride film or a silicon oxide film may be formed as a passivation film by using a chemical vapor deposition (CVD) method between the p-side electrode 16 and the n-side electrode 17, and on the end face (side surface) of the light emitting layer 13. In addition, activated annealing may be performed as necessary for forming an ohmic contact between each electrode and the semiconductor layer.

Next, after all the parts formed on the major face of the substrate 10 are covered with an insulating film 18 shown in FIG. 6A, and the insulating film 18 is patterned, for example, by using we etching, whereby first openings 18a and a second opening 18b are selectively formed in the insulating film 18. A plurality of the first openings 18a are formed in the insulating film 18, and each of the first openings 18a reaches the p-side electrodes 16. The second opening 18b also reaches the n-side electrode 17.

For example, an organic material such as a photosensitive polyimide or benzocyclobutene can be used as the material of the insulating film 18. In such a case, the insulating film 18 can be directly exposed and developed using photo-lithography, and the first and second openings 18a, 18b are directly formed therein without using a resist mask.

Alternatively, an inorganic film such as a silicon nitride film or a silicon oxide film may be used as the insulating film 18. In a case where the insulating film 18 is an inorganic film, the first openings 18a and the second opening 18b are formed using selective etching using a resist mask formed on the insulating film 18.

Next, as shown in FIG. 6B, a metal film 19 is formed on the surface of the insulating film 18, the inner face (the side wall and the bottom portion) of the first opening 18a, and the inner face (the side wall and the bottom portion) of the second opening 18b. The metal film 19 is used as a seed metal for plating, as described later.

The metal film 19, for example, is formed using a sputtering method. The metal film 19 includes a stacked film, for example, in which a titanium (Ti) layer and a copper (Cu) layer are stacked in order from the insulating film 18 side. Alternatively, an aluminum layer may be used instead of the titanium layer.

Next, as shown in FIG. 6C, resists 91 are selectively formed on the metal film 19, and Cu electroplating is performed using the metal film 19 as a current path.

Figure 7A:
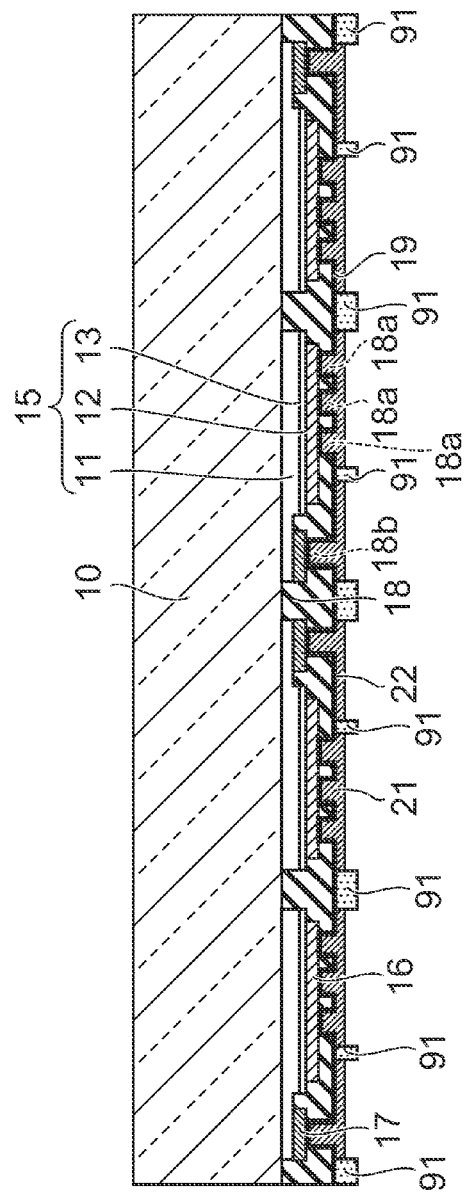
Figure 7B:
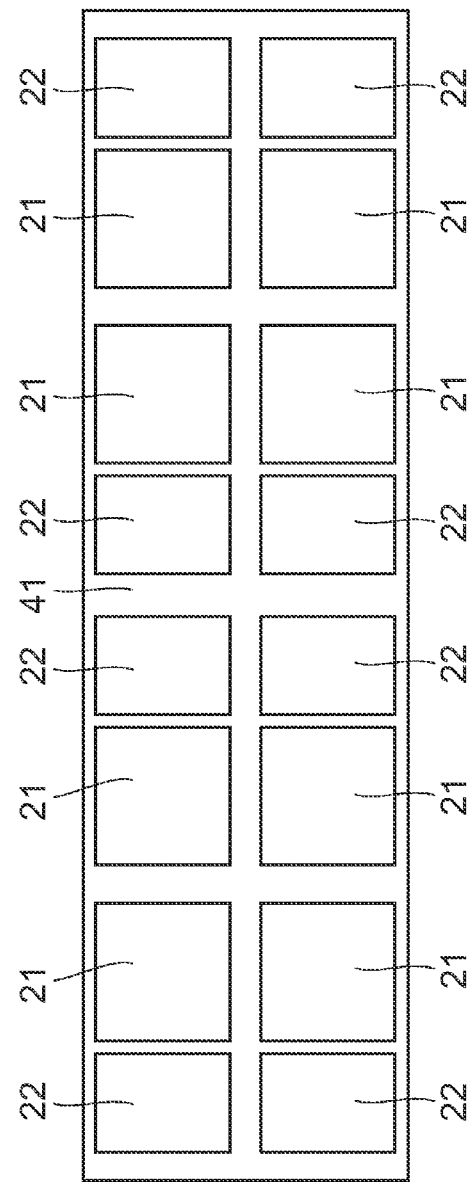

Accordingly, as shown in FIG. 7A and FIG. 7B corresponding to the lower face of FIG. 7A, a p-side interconnection layer 21 and an n-side interconnection layer 22 are selectively formed on the metal film 19. The p-side interconnection layer 21 and the n-side interconnection layer 22 are simultaneously formed, for example, by using copper plating.

The p-side interconnection layer 21 is also formed inside the first openings 18a and is electrically connected to the p-side electrode 16 via the metal film 19. In addition, the n-side interconnection layer 22 is formed also inside the second openings 18b and is electrically connected to the n-side electrodes 17 via the metal film 19.

The resists 91 that are used for plating the p-side interconnection layer 21 and the n-side interconnection layer 22 are removed using solvent or oxygen plasma.

Next, as shown in FIG. 8A and FIG. 8B corresponding to the lower face of FIG. 8A, resists 92 are formed for forming metal pillars. The resist 92 is thicker than the above-described resist 91. It may be possible to leave the resists 91 without removing in the previous process, and the resists 92 are formed so as to overlap the resists 91. First openings 92a and second openings 92b are formed in the resists 92.

Then, Cu electroplating is performed using the metal film 19 as a current path and the resists 92 as a mask. Accordingly, as shown in FIG. 9A and FIG. 9B corresponding to the lower face of FIG. 9A, a p-side metal pillar 23 and an n-side metal pillar 24 are formed on the p-side interconnection layer 21 and n-side interconnection layer 22 respectively.

The p-side metal pillar 23 is formed on the p-side interconnection layer 21 inside the first opening 92a that is formed in the resist 92. The n-side metal pillar 24 is formed on the n-side interconnection layer 22 inside the second opening 92b that is formed in the resist 92. The p-side metal pillar 23 and the n-side metal pillar 24 are simultaneously formed using copper plating, for example.

The resist 92, as shown in FIG. 10A is removed, for example, by using solvent or oxygen plasma. Thereafter, exposed parts of the metal film 19 are removed by we etching while using the p-side metal pillar 23, the n-side metal pillar 24, the p-side interconnection layer 21, and the n-side interconnection layer 22 as a mask. Accordingly, as shown in FIG. 10B, the p-side interconnection layer 21 and the n-side interconnection layer 22 is separated from each other on the insulating film 18, and the electric connection is cut off therebetween.

Next, as shown in FIG. 11A, an insulating film 25 is stacked on the insulating film 18. The insulating film 25 covers the p-side interconnection layer 21, the n-side interconnection layer 22, the p-side metal pillar 23, and the n-side metal pillar 24. The insulating film 25 has an insulating property. In addition, for example, carbon black may be dispersed in the insulating film 25 so as to shield the light emitted from the light emitting layer 13.

Next, the substrate 10 is removed as shown in FIG. 11B. In a case where the substrate 10 is a sapphire substrate, the substrate 10 can be removed, for example, using a laser lift-off method. In a case where the substrate 10 is a silicon substrate, the substrate 10 can be removed by etching from the first semiconductor layer 11. The semiconductor layer 15 is reinforced by the p-side metal pillar 23, the n-side metal pillar 24, and the insulating film 25, and accordingly, the wafer shape can be maintained even after the substrate 10 is removed therefrom.

When using a laser lift-off method, laser light is radiated from the backside of the substrate 10 toward the first semiconductor layer 11. The laser light has transparency for the substrate 10 and has a wavelength in an absorption band of the first semiconductor layer 11. When the laser light arrives at an interface between the substrate 10 and the first semiconductor layer 11, part of the first semiconductor layer 11 that is located near the interface absorbs energy of the laser light and decomposes. The first semiconductor layer 11 is decomposed into gallium (Ga) and nitrogen gas. According to the decomposition reaction, a minute gap is formed between the substrate 10 and the first semiconductor layer 11, whereby the substrate 10 and the first semiconductor layer 11 are separated from each other.

Strong internal stress is contained between the substrate 10 and the semiconductor layer 15 during the epitaxial growth, and released at once when removing the substrate 10. According to the embodiment, the insulating film 25, and the metal that configures the p-side metal pillar 23 and the n-side metal pillar 24 are more flexible than the material of the semiconductor layer 15. That is, the semiconductor layer 15 is supported by the flexible support members. Accordingly, the released stress may be absorbed by the insulating film 25, the p-side metal pillar 23 and the n-side metal pillar 24, thereby preventing the semiconductor layer 15 from being destroyed.

The first face 15a of the semiconductor layer 15 is cleaned after removing the substrate 10 therefrom. For example, gallium (Ga) that is stuck to the first face 15a is removed by using rare hydrofluoric acid or the like. Thereafter, we etching is performed for the first face 15a, for example, by using a potassium hydroxide (KOH) solution, tetramethylammonium hydroxide (TMAH), or the like. Accordingly, the concavo-convex is formed on the first face 15a due to a difference in the etching speed that depends on the direction of the crystal plane, as shown in FIG. 12A. Alternatively, the concavo-convex may be formed on the first face 15a by etching using a resist mask. The concavo-convex formed on the first face 15a may improve the light extraction efficiency.

Next, as shown in FIG. 12B, a transparent resin layer 30 is formed on the first face 15a. The transparent resin layer 30 is also formed on the insulating film 18 between semiconductor layers 15 adjacent to each other. More specifically, the transparent resin 31 is thermally cured after a transparent resin 31 of a liquid phase in which scattering substances 32 are dispersed is supplied to the upper side of the first face 15a, for example, using a method such as a printing method, a potting method, a molding method, or a compression molding.

Subsequently, the surface (the lower face in FIG. 12B) of the insulating film 25 is ground such that the p-side external terminals 23a and the n-side external terminals 24a are exposed as shown in FIG. 13A and FIG. 13B corresponding to the lower face of FIG. 13A.

Thereafter, along the groove 80 between the adjacent semiconductor layers 15, the wafer is diced through the transparent resin layer 30, the insulating film 18, and the insulating film 25 so as to separate into a plurality of semiconductor light emitting devices 1. For example, the dicing is performed using a dicing blade. Alternatively, the dicing may be performed using laser radiation. In addition, the semiconductor light emitting device 1 may have a single chip structure that includes one semiconductor layer 15 or a multiple-chip structure that includes a plurality of semiconductor layers 15.

When the dicing is performed, the substrate 10 has been already removed. In addition, since the semiconductor layer 15 is also removed in the groove 80, the semiconductor layer 15 can be prevented from damage, while the dicing is performed. In addition, the end portion (side surface) of the semiconductor layer 15 is covered with the insulating film 18. Thereby, the protection of the end portion can be obtained without any additional process after dicing into the plurality of semiconductor light emitting devices 1.

Since the above-described manufacturing process before dicing are performed in the wafer state, and each diced device includes a package protecting the semiconductor 15 and the interconnection formed therein, it is possible to significantly reduce the production cost. In other words, the interconnection and the packaging are completed at the diced state. Accordingly, it is possible to improve the productivity, and to reduce the manufacturing cost.

As an alternative example of the embodiment, the p-side interconnection layer 21 and the n-side interconnection layer 22 may be directly bonded to the pads of the mounting substrate without providing the p-side metal pillar 23 and the n-side metal pillar 24.

Furthermore, the p-side interconnection layer 21 and the p-side metal pillar 23 are not limited to be the separately formed ones, and the p-side interconnection may be provided with the p-side interconnection layer 21 and the p-side metal pillar 23, which are formed into a single body in the same process. Similarly, the n-side interconnection layer 22 and the n-side metal pillar 24 are not limited to be the separately formed ones, and the n-side interconnection may be provided with the n-side interconnection layer 22 and the n-side metal pillar 24, which is formed into a single body in the same process.

Second Embodiment

Figure 14:
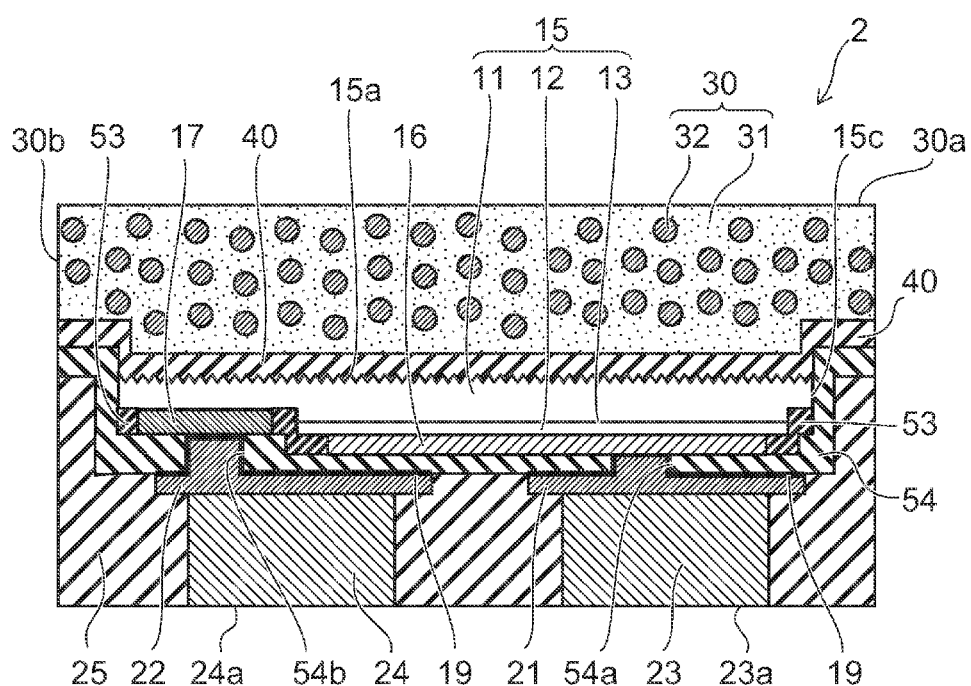
FIG. 14 is a schematic cross-sectional view illustrating a semiconductor light emitting device according to a second embodiment.

FIG. 14 is a schematic cross-sectional view of a semiconductor light emitting device 2 according to a second embodiment. The semiconductor light emitting device 2 includes a semiconductor layer 15. The semiconductor layer 15 includes a first face 15a and a second face 15b opposite to the first face 15a (see FIG. 15). A transparent resin layer 30 including a scattering substance 32 is provided on the first face 15a. In the embodiment, an inorganic film 40 is provided between the first face 15a and the transparent resin layer 30. On the other hand, electrodes and interconnections are provided on the second face 15b side. The semiconductor layer 15 includes a light emitting layer 13, and externally emits light emitted from the light emitting layer 13 from the first face 15a through the inorganic film 40 and the transparent resin 30.

The second face 15b of the semiconductor layer 15 is processed in a concavo-convex shape. A convex portion, which is a first portion, includes the light emitting layer 13. A p-side electrode 16 is provided on the surface of a second semiconductor layer 12, which is the surface of the convex portion. In other words, the p-side electrode 16 is provided on the second face 15b of the first portion including the light emitting layer 13.

A second portion not including the light emitting layer 13 is provided side by side with the convex portion on the second face 15b of the semiconductor layer 15. An n-side electrode 17 is provided on the surface of a first semiconductor layer 11 of the second portion. Namely, the n-side electrode 17 is provided on the second face 15b of the second portion not including the light emitting layer 13.

On the second face 15b of the semiconductor layer 15, the area of the second semiconductor layer 12 including the light emitting layer 13 is wider than the area of the first semiconductor layer 11 not including the light emitting layer 13. The area of the p-side electrode 16 provided on the portion including the light emitting layer 13 is wider than the area of the n-side electrode 17 provided on the portion not including the light emitting layer 13. With this configuration, a wide light emitting portion can be obtained.

A first insulating film (herein after referred to as an insulating film 54) is provided on the second face 15b side of the semiconductor layer 15. The insulating film 54 covers the second face 15b of the semiconductor layer 15, the p-side electrode 16, and the n-side electrode 17. The insulating film 54 further covers a side face 15c of the semiconductor layer 15, and contacts the inorganic film 40 at the outer edge of the first face 15a. Preferably, the insulating film 54 is an inorganic film such as a silicon oxide film or a silicon nitride film, for example. Namely, preferably, the semiconductor layer 15 is covered with an inorganic film. An insulating film 53 covering the light emitting layer 13 and the side face of the second semiconductor layer 12 (the side face of the convex portion) may be provided between the insulating film 54 and the semiconductor layer 15.

A p-side interconnection layer 21 and an n-side interconnection layer 22 are provided apart from each other on the face of the insulating film 54 opposite to the second face 15b of the semiconductor layer 15. The p-side interconnection layer 21 is electrically connected to the p-side electrode 16 through an opening 54a (a first opening) provided in the insulating film 54. The n-side interconnection layer 22 is electrically connected to the n-side electrode 17 through an opening 54b (a second opening) formed in the insulating film 54.

A p-side metal pillar 23 is provided on the face of the p-side interconnection layer 21 opposite to the p-side electrode 16. The p-side interconnection layer 21, the p-side metal pillar 23, and a metal film 19 used for a seed layer, as described later; configure a p-side interconnection in the embodiment.

An n-side metal pillar 24 is provided on the face of the n-side interconnection layer 22 opposite to the n-side electrode 17. The n-side interconnection layer 22, the n-side metal pillar 24, and the metal film 19 configure an n-side interconnection in the embodiment.

An insulating film 25 is provided on the insulating film 54. The insulating film 25 is provided between the p-side metal pillar 23 and the n-side metal pillar 24. The insulating film 25 covers the periphery of the p-side interconnection and the periphery of the n-side interconnection.

The side face of the p-side metal pillar 23 and the side face of the n-side metal pillar 24 are covered with the insulating film 25. The face of the p-side metal pillar 23 opposite to the p-side interconnection layer 21 is exposed from the insulating film 25, and serves as a p-side external terminal 23a. The face of the n-side metal pillar 24 opposite to the n-side interconnection layer 22 is exposed from the insulating film 25, and serves as an n-side external terminal 24a. Namely, the p-side external terminal 23a and the n-side external terminal 24a are exposed from the same face of the insulating film 25 (in the lower surface in FIG. 14), and joined to pads provided on a mounting substrate through a bonding material such as solder, other metals, and a conductive material, for example.

The configurations of the p-side interconnection and the n-side interconnection are the same as the first embodiment except the number of the openings 54a provided on the insulating layer 54, and may exhibit the similar advantages. Fine concavity and convexity are also formed on the first face 15a of the semiconductor layer 15 by we etching (frosting) using an alkaline liquid solution for improving the efficiency of extracting light emitted from the light emitting layer 13.

In the semiconductor light emitting device 2 according to the embodiment, the transparent resin layer 30 including the scattering substance 32 is provided on the first face 15a, so that the distribution of light can be widened. The inorganic film 40 is provided between the first face 15a and the transparent resin layer 30, so that the heat dissipation of the semiconductor layer 15 may be improved.

For example, the thermal conductivity coefficient of an inorganic film such as a silicon oxide film and a silicon nitride film is greater than the thermal conductivity coefficient of the resin layer. Therefore, the inorganic film 40 is additionally provided between the first face 15a and the transparent resin layer 30, so that heat generated in the light emitting layer 13 can be more efficiently dissipated through the p-side interconnection layer 21 and the n-side interconnection layer 22, for example.

The inorganic film 40 is provided on the first face 15a, and the insulating film 54 provided on the second face 15b side is an inorganic film, so that the semiconductor layer 15 is covered with the inorganic film. Accordingly, it becomes possible to suppress the penetration of moisture or heavy metal into the semiconductor layer 15, and to improve the reliability of the semiconductor light emitting device 2. For example, the inorganic film 40 and the insulating film 54 are formed of silicon nitride films, so as to suppress the migration of metal atoms such as Cu.

Next, a manufacturing method for the semiconductor light emitting device 2 according to the embodiment will be described with reference to FIGS. 15A to 19B. FIGS. 15A to 19B are partial schematic views illustrating a wafer in the manufacturing process. FIG. 15A is a top face view, and FIGS. 15B to 19B are partial cross sections of a wafer in the process.

FIGS. 15A and 15B show a state in which the p-side electrode 16 and the n-side electrode 17 are formed on the semiconductor layer 15 provided on a substrate 20. A silicon substrate is used for the substrate 20.

The semiconductor layer 15 is formed on the major surface of the substrate 20, including the first semiconductor layer 11, the light emitting layer 13, and the second semiconductor layer 12 stacked in order. The second semiconductor layer 12 and the light emitting layer 13 are selectively etched to form a convex portion 16a.

The insulating film 53 is formed to cover the second face 15b, that is, the top face and side face of the convex portion 16a and the exposed surface of the first semiconductor layer 11. The insulating film 53 is a silicon oxide film or a silicon nitride film, for example, and protects the light emitting layer 13 and the second semiconductor layer 12 exposed in the side face of the convex portion 16a.

The p-side electrode 16 is formed on the top face of the convex portion 16a. The p-side electrode 16 contacts the second semiconductor layer 12 through the opening 53a provided in the insulating film 53. On the other hand, the n-side electrode 17 is formed on the portion in which the first semiconductor layer 11 is exposed through the opening 53b provided in the insulating film 53. Namely, the p-side electrode 16 is formed on the second face 15b of the portion including the light emitting layer 13 (i.e. the convex portion), and the n-side electrode 17 is formed on the second face 15b of the portion not including the light emitting layer 13.

Subsequently, a groove 83 is formed as shown in FIG. 16A. The groove 83 penetrates through the insulating film 53 and the semiconductor layer 15, and reaches the substrate 20. The groove 83 can be formed by RIE (Reactive Ion Etching) using a resist mask (not shown), for example. The groove 83 is formed in a grid configuration, for example, on the substrate 20 in the wafer state, and separates the semiconductor layer 15 into a plurality of chips. The substrate 20 is also etched in the groove 83, forming a recess 83a in the major surface of the substrate 20.

Subsequently, as shown in FIG. 16B, the insulating film 54 is formed so as to cover the semiconductor layer 15, the p-side electrode 16, the n-side electrode 17, and the inside of the groove 83. The insulating film 54 covers the side face 15c of the semiconductor layer 15, and fills the recess 83a. An inorganic film such as a silicon nitride film or a silicon oxide film is used for the insulating film 54, for example.

Next, as shown in FIG. 16C, the insulating film 54 is patterned by we etching, for example, and the first opening 54a and the second opening 54b are selectively formed in the insulating film 54. The p-side interconnection layer 21 is formed so as to communicate with the p-side electrode 16 through the first opening 54a and the n-side interconnection layer 22 is formed so as to communicate with the n-side electrode 17 through the second opening 54b. The p-side interconnection layer 21 and the n-side interconnection layer 22 are formed by Cu plating using the metal film 19 provided on the insulating film 54 as a seed layer, for example, (see FIG. 6 and FIG. 7).

As shown in FIG. 17A, the p-side metal pillar 23 and the n-side metal pillar 24 are formed on the p-side interconnection layer 21 and the n-side interconnection layer 22, respectively. The p-side metal pillar 23 and the n-side metal pillar 24 are also formed by Cu plating using the metal film 19 as a seed layer, for example, (see FIG. 8 to FIG. 10).

Subsequently, as shown in FIG. 17B, the insulating film 25 is stacked on the insulating film 54. The insulating film 25 is a resin covering the p-side interconnection layer 21, the n-side interconnection layer 22, the p-side metal pillar 23, and the n-side metal pillar 24, for example. The insulating film 25 may include carbon black or titanium oxide so as to provide light shielding for light emitted from the light emitting layer 13, for example.

Figure 18A:
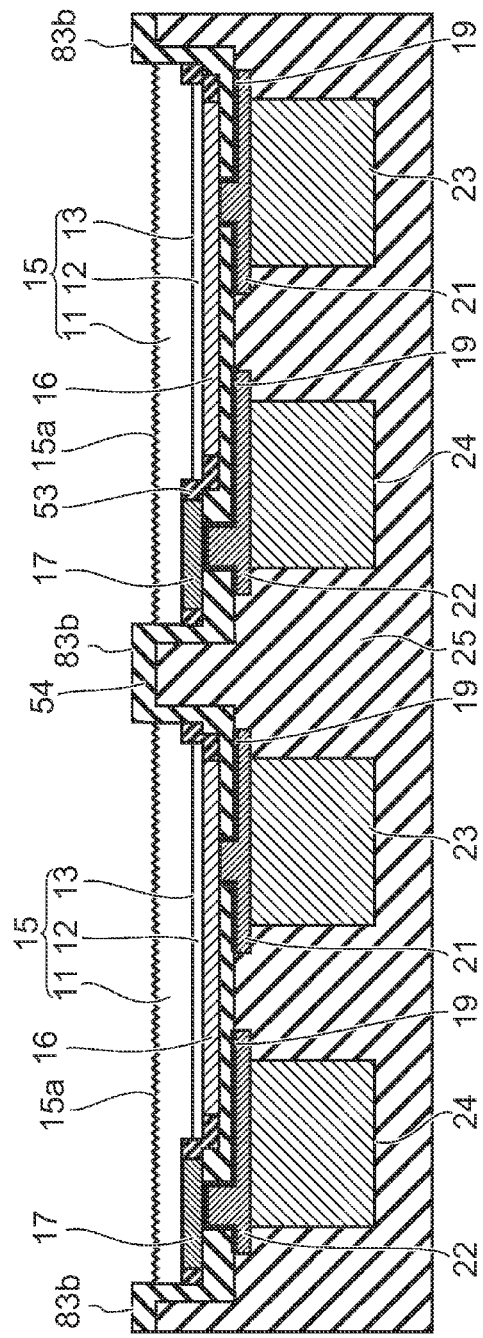

Subsequently, as shown in FIG. 18A, the substrate 20 is removed by we etching, for example. Since the semiconductor layer 15 is reinforced by the p-side metal pillar 23, the n-side metal pillar 24, and the insulating film 25, the semiconductor layer 15 can maintain the wafer shape after removing the substrate 20. The insulating film 54 filled in the recess 83a of the substrate 20 is left on the first face 15a side as a bank 83b surrounding the outer edge of the semiconductor layer 15.

The first face 15a of the semiconductor layer 15 from which the substrate 20 is removed is wet-etched in order to form fine concavity and convexity therein. The fine concavity and convex may also be formed in the first face 15a using a resist pattern as the etching mask.

Figure 18B:
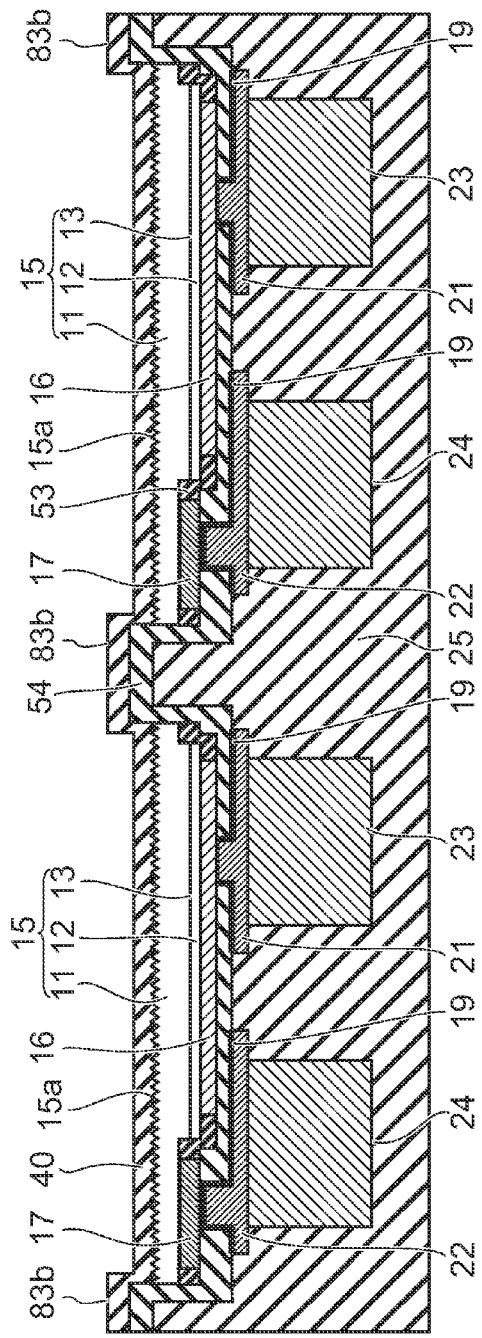

Subsequently, as shown in FIG. 18B, the inorganic film 40 is formed on the first face 15a and the bank 83b. The inorganic film 40 is a silicon nitride film formed by sputtering, for example. The bank 83b is formed to surely contact the inorganic film 40 with the insulating film 54. Thus, the surface of the semiconductor layer 15 is covered with the insulating film 54 and the inorganic film 40.

Subsequently, as shown in FIG. 19A, the transparent resin layer 30 is formed on the inorganic film 40. The transparent resin layer 30 is also formed on the bank 83b between the adjacent semiconductor layers 15. More specifically, the liquid transparent resin 31 having the scattering substance 32 dispersed therein is supplied on the first face 15a using a method such as printing, potting, molding, and compression molding, for example, and then the liquid transparent resin 31 is thermally set.

Subsequently, as shown in FIG. 19B, the surface of the insulating film 25 (the lower surface in FIG. 19A) is ground to expose the p-side external terminal 23a, which is the end surface of the p-side metal pillar 23, and the n-side external terminal 24a, which is the end surface of the n-side metal pillar 24.

After exposing the terminals 23a and 24a, the insulating film 25, the transparent resin layer 30, and the insulating film 54 are cut along the bank 83b between the adjacent semiconductor layers 15, and the wafer is separated into a plurality of the semiconductor light emitting devices 2. For example, the wafer may be cut using a dicing blade, or by applying a laser beam. It is noted that the semiconductor light emitting devices 2 separated into dies may have a single chip structure including one semiconductor layer 15, or may have a multi-chip structure including a plurality of the semiconductor layers 15.

In the variation of the embodiment, a transparent resin layer 30 not including the scattering substance 32 may be provided on the first face 15a of the semiconductor layer 15. In this case, although the advantage of widening the distribution of light emitted from the light emitting layer 13 is not obtained, heat dissipation can be improved by the inorganic film 40, and the migration of moisture and metal atoms into the semiconductor layer 15 can be suppressed. A fluorescent body that is excited by light emitted from the light emitting layer 13 may be dispersed in the transparent resin layer 30.

Third Embodiment

Figure 20A:
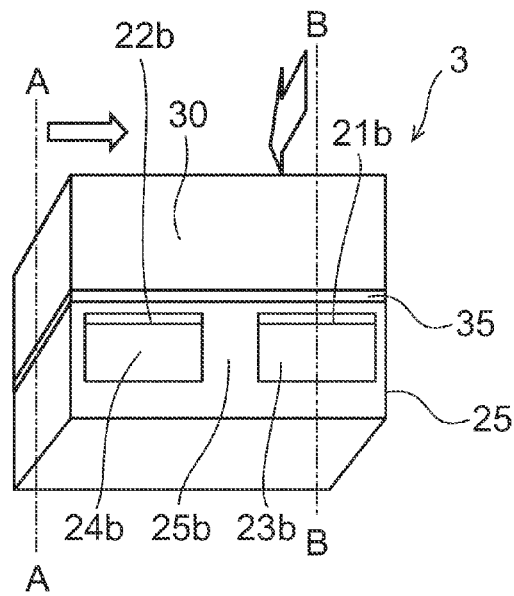
FIGS. 20A to 20C are schematic views illustrating a semiconductor device according to a third embodiment.
Figure 20B:
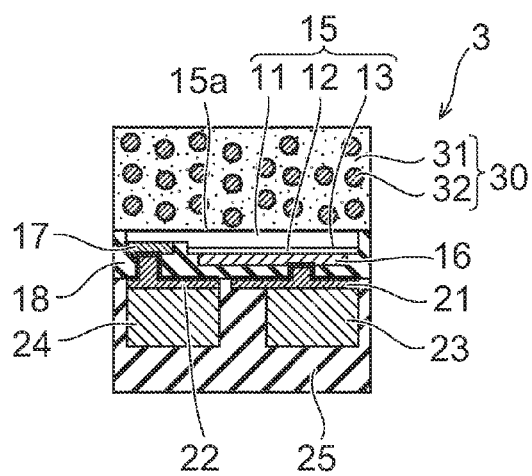
Figure 20C:
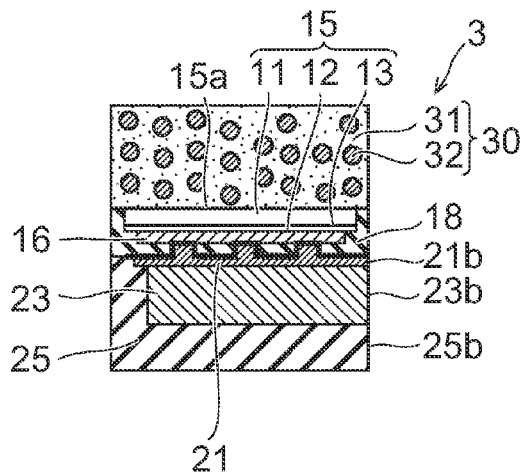
Figure 21:
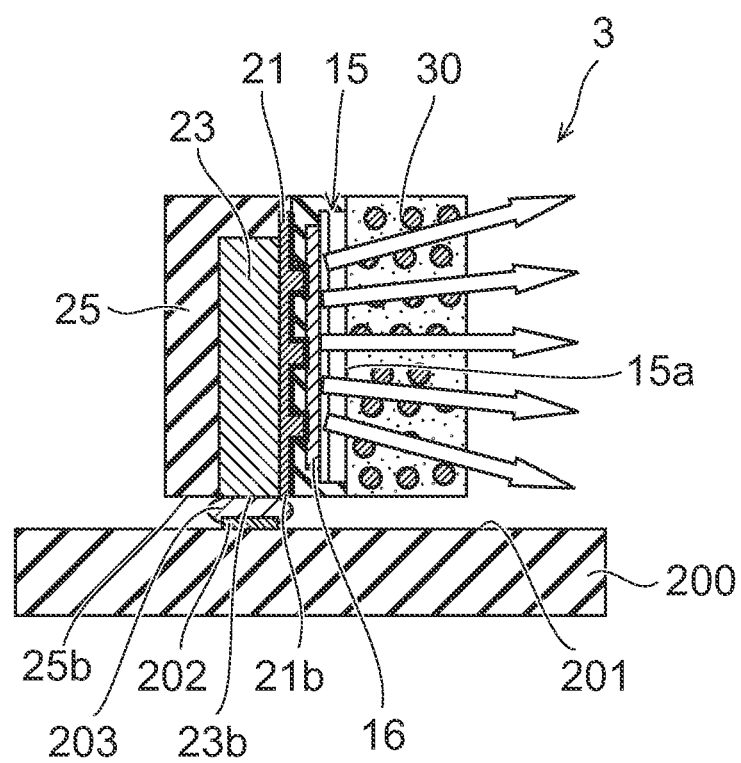
FIG. 21 is a schematic cross-sectional view illustrating the semiconductor device according to the third embodiment, wherein the device is mounted on a substrate.

FIG. 20A is a schematic perspective view of a semiconductor light emitting device 3 according to a third embodiment. FIG. 20B is a cross-sectional view taken along line A-A shown in FIG. 20A. FIG. 20C is a cross-sectional view taken along line B-B shown in FIG. 20A. FIG. 21 is a schematic cross-sectional view of a light emitting module in which the semiconductor light emitting device 3 is mounted on a mounting substrate 200.

As shown in FIGS. 20A and 20C, a part of the side surface of the p-side metal pillar 23 is exposed from the insulating film 25 on a third face 25b that has a plane orientation different from the first face 15a and the second face of the semiconductor layer 15. The exposed face serves as a p-side external terminal 23b for mounting the semiconductor light emitting device on an external mounting substrate.

The third face 25b is a face that is approximately perpendicular to the first face 15a and the second face of the semiconductor layer 15. The insulating film 25, for example, has four side surfaces of a rectangular shape, and one of the four side surfaces is the third face 25b.

A part of the side surface of the n-side metal pillar 24 is also exposed from the insulating film 25 on the third face 25b. The exposed face serves as an n-side external terminal 24b for mounting the semiconductor light emitting device on the mounting substrate.

In addition, as shown in FIG. 20A, a part of the side surface 21b of the p-side interconnection layer 21 is also exposed in the third face 25b of the insulating film 25 and serves as a p-side external terminal. Similarly, a part of the side surface 22b of the n-side interconnection layer 22 is also exposed in the third face 25b of the insulating film 25 and serves as an n-side external terminal.

Parts of the p-side metal pillar 23 other than the p-side external terminal 23b that is exposed in the third face 25b is covered with the insulating film 25. In addition, parts of the n-side metal pillar 24 other than the n-side external terminal 24b that is exposed in the third face 25b is covered with the insulating film 25.

In addition, parts of the p-side interconnection layer 21 other than the side surface 21b that is exposed in the third face 25b is covered with the insulating film 25. In addition, parts of the n-side interconnection layer 22 other than the side surface 22b that is exposed in the third face 25b is covered with the insulating film 25.

On the other hand, a transparent resin layer 30 including a scattering substance 32 is provided on the first face 15a. An inorganic film 40 may be provided between the first face 15a and the transparent resin layer 30.

The semiconductor light emitting device 3, as shown in FIG. 21, is mounted in a posture in which the third face 25b faces the mounting face 201 of the mounting substrate 200. The p-side external terminal 23b and the n-side external terminal 24b that are exposed in the third face 25b are bonded to the pad 202 that is formed on the mounting face 201 through soldering 203. In addition, an interconnection pattern is formed on the mounting face 201 of the mounting substrate 200, and the pad 202 is connected to the interconnection pattern.

The third face 25b is approximately perpendicular to the first face 15a that is the major light emitting face. Accordingly, in the posture in which the third face 25b is disposed toward the lower side, i.e. facing the mounting face 201 side, the first face 15a faces in the horizontal direction, not the upper side of the mounting face 201.

That is, the semiconductor light emitting device 3 is a so-called side view type device in which light is emitted in the horizontal direction in a case where the mounting face 201 is set as the horizontal plane. Also in the embodiment, the transparent resin layer 30 including the scattering substance 32 provided on the first face 15a increases the radiation angle of light, and the distribution of light can be widened.

Fourth Embodiment

FIG. 22A and FIG. 22B are schematic views of a light source unit 100 according to a fourth embodiment. FIG. 22A is a plan view illustrating an arrangement of semiconductor light emitting devices mounted on a mounting substrate 150. FIG. 22B is a cross-sectional view along a line C-C in FIG. 22B.

The light source unit 100 includes a mounting substrate 150, a plurality of semiconductor light emitting devices 5 mounted on the mounting substrate 150, a first resin layer (herein after referred to as a resin layer 160) covering the semiconductor light emitting devices 5 and the mounting substrate 150, and a second resin layer (herein after referred to as a resin layer 170) provided on the first resin layer.

The mounting substrate 150 includes a metal base 101, an insulating layer 102 provided on the metal base 101, and a plurality of interconnections 103 provided on the insulating layer 102, for example. The mounting substrate 150 includes a solder resist 107 covering the interconnections 103 and the insulating film 102.

The semiconductor light emitting device 5 includes a semiconductor layer 15, an insulating layer 18 covering the semiconductor layer 15, and an insulating layer 25 provided on the insulating layer 18, for example. The semiconductor layer 15 has a first face 15a and a second face 15b opposite to the first face 15a, and includes an semiconductor layer 11, a light emitting layer 13, and a semiconductor layer 12 (see FIG. 1).

The semiconductor device 5 includes a p-side electrode 16 and an n-side electrode 17. The p-side electrode 16 is provided on the portion of the semiconductor layer 15 including the light emitting layer 13 on the second face 15b side. The n-side electrode 17 is provided on the portion of the semiconductor layer 15 not including the light emitting layer 13 on the second face 15b side.

The semiconductor device 5 further includes the insulating film 18, the p-side interconnection, the n-side interconnection, and the insulating film 25. The insulating film 18 covers the semiconductor layer 15, the p-side electrode 16, and the n-side electrode 17. The p-side interconnection and the n-side interconnection are provided on the insulating film 18. The p-side interconnection is electrically connected to the p-side electrode 16 through an opening 18a provided on the insulating film 18. The n-side interconnection is electrically connected to the n-side electrode 17 through an opening 18b provided on the insulating film 18. The insulating film 25 is provided on the insulating film 18 between the p-side interconnection and the n-side interconnection.

For example, the p-side interconnection includes a p-side interconnection layer 21 connected to the p-side electrode 16 and a p-side metal pillar 23 provided on the p-side interconnection layer 21. The n-side interconnection includes an n-side interconnection layer 22 connected to the n-side electrode 17 and an n-side metal pillar 24 provided on the n-side interconnection layer 22.

The semiconductor device 5 is mounted in such a way that the second face 15b faces the mounting substrate 150. For example, the p-side interconnection and the n-side interconnection are connected to the interconnections 103 through a solder 105. Namely, the p-side metal pillar 23 and the n-side metal pillar 24 exposed from the insulating layer 25 are connected to the interconnections 103. The semiconductor device 5 is electrically connected to an external driver through the interconnections 103. In the embodiment, the p-side interconnection and the n-side interconnection of the adjacent semiconductor devices 5 are connected to each other with a single interconnection 103, and a plurality of the semiconductor devices 5 are connected to each other in series.

The resin layer 160 covers the first face 15a and side face of the semiconductor device 5 and the surface of the mounting substrate 150 between the adjacent semiconductor devices 5. The resin layer 160 transmits light emitted from the light emitting layer 13, which is radiated on the first face side.

The resin layer 170 includes a fluorescent substance 171 that is excited by light emitted from the light emitting layer 13 and emits light having a different wavelength from the wavelength of the exciting light. The resin layer 170 transmits light emitted from the light emitting layer 13 and the light emitted from the fluorescent substance 171.

The semiconductor light emitting devices 5 are disposed on the mounting substrate 150 in a matrix configuration, for example. Namely, as shown in FIG. 22A, the semiconductor light emitting devices 5 are provided side by side with an equal distance in a first direction (in an X-direction) on the mounting substrate 150 and in a second direction (in a Y-direction) orthogonal to the first direction. The light source unit 100 includes the semiconductor devices 5 thus disposed, and operates as a surface light source by simultaneously emitting light from the semiconductor devices 5 through the interconnections 103, for example.

In the embodiment, the resin layer 170 including the fluorescent body 171 is provided on the resin layer 160 covering the semiconductor devices 5 and the mounting substrate 150, so that the surface light source can be implemented, which suppresses color shading and uniformly of the light emission. Namely, the resin layer 160 includes a flat surface absorbing the irregularity of the mounting substrate 150 on which the semiconductor devices 5 are mounted. Thereby, the fluorescent body 171 is uniformly distributed in the XY plane in the resin layer 170 provided on the resin layer 160.

Furthermore, the refractive index of the resin layer 160 is preferably greater than the refractive index of the insulating layer 18 covering the side face of the semiconductor layer 15. Namely, the total reflection on the interface between the insulating layer 18 and the resin layer 160 can be suppressed, and light emitted from the side face of the semiconductor light emitting device 5 can be made uniform.

FIGS. 23A and 23B are schematic cross-sectional views of light source units 110 and 120 according to variations of the fourth embodiment.

The light source unit 110 shown in FIG. 23A includes the mounting substrate 150, a plurality of the semiconductor devices 5 mounted on the mounting substrate 150, the resin layer 180 covering the semiconductor light emitting devices 5 and the mounting substrate 150, and the resin layer 170 provided on the resin layer 180.

The resin layer 180 transmits light emitted from the light emitting layer 13. The resin layer 180 includes a scattering substance 181 that scatters light emitted from the light emitting layer 13. Thereby, the light emitted from the semiconductor light emitting devices 5 is made uniform, and the distribution of light can be widened. The resin layer 180 filled between the adjacent semiconductor light emitting devices 5 scatters light emitted from the side faces of the semiconductor light emitting devices 5, and reduces optical interference between the lights emitted from the adjacent light emitting devices. Accordingly, fluctuations of light emission in the light source unit 110 are suppressed, thereby implementing uniform surface emission.

The light source unit 120 shown in FIG. 23B includes the mounting substrate 150, a plurality of the semiconductor devices 5 mounted on the mounting substrate 150, the resin layer 160 covering the semiconductor light emitting devices 5, a third resin layer (hereinafter referred to as a resin layer 190) filled on a substrate between the adjacent semiconductor light emitting devices 5, and the resin layer 170 provided on the resin layers 160 and 190.

The resin layer 190 is provided between the resin layers 160 covering the semiconductor light emitting devices 5 in an island shaped arrangement. The resin layer 190 includes a phosphor material having a longer light emission period than the fluorescent substance 171 included in the resin layer 170. A metal complex such as iridium complex can be used for the phosphor material, for example.

Then, fluctuations of light emission can be reduced in the light source unit 120. For example, in the case where the light source unit 110 is directly driven with a commercial power supply of 50 Hz or 60 Hz, flickers of the light emission is induced corresponding to the power supply frequency. In the embodiment, even after light emitted from the light emitting layer 13 and light emitted from the fluorescent substance 171 has dropped corresponding to a reduction in a supply voltage, light is continuously emitted from the phosphor material included in the resin layer 190. Accordingly, the flickers in the light source unit 120, that is, fluctuations of light emission with over time can be suppressed.

Figure 24A:
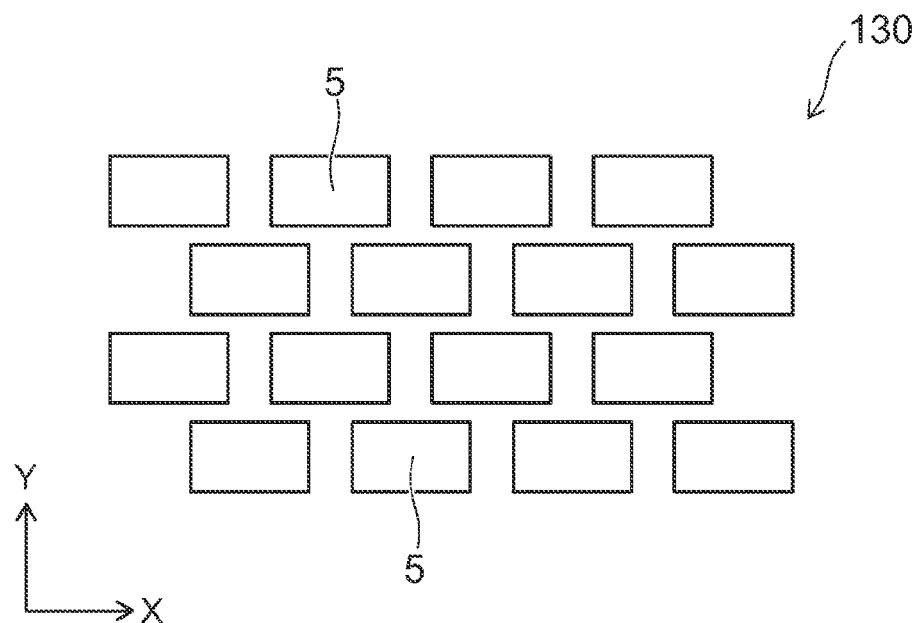
FIGS. 24A and 24B are schematic plan views illustrating light source units according to other embodiments of the fourth embodiment.
Figure 24B:
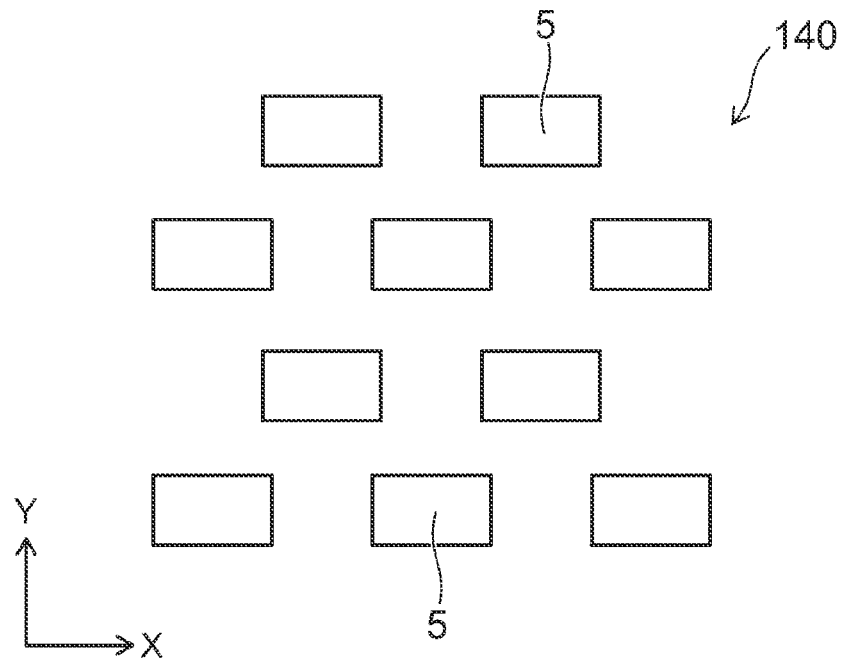

FIG. 24A and FIG. 24B are schematic plan views of light source units 130 and 140 according to other variations of the fourth embodiment.

The light source unit 130 shown in FIG. 24A includes a plurality of the semiconductor light emitting devices 5 disposed on the mounting substrate 150 in a staggered configuration. Namely, the semiconductor light emitting devices 5 are provided side by side with an equal distance in the X-direction. The semiconductor light emitting devices 5 are arranged in such a way that the phases of arrangement in the X-direction are alternately shifted in the Y-direction. Thus, it becomes possible to suppress the fluctuations of the light emission in the semiconductor light emitting devices 5, since the regularity of radiant points is disturbed in this arrangement. It is also possible to suppress the mutual interference of light horizontally emitted from the semiconductor light emitting devices 5.

In the light source unit 140 shown in FIG. 24B, the distance between the adjacent semiconductor light emitting devices 5 is made wider than the distance in FIG. 24A. For example, the distances between the semiconductor light emitting devices 5 in the X-direction and the Y-direction are made wider than the size of the semiconductor light emitting device 5 in the X-direction and the Y-direction respectively. Namely, the distance between the adjacent semiconductor light emitting devices 5 is provided wider than the size of the semiconductor light emitting device 5 in any arrangement directions on the mounting substrate 150. Thereby, the heat of the semiconductor light emitting devices 5 can be efficiently dissipated through the mounting substrate 150.

The light source unit 140 includes the resin layer 180 covering the semiconductor light emitting devices 5 and the resin layer 170 provided on the resin layer 180. Namely, the scattering substance 181 is dispersed in the resin layer covering the semiconductor light emitting devices 5, so that the distribution of light of the semiconductor light emitting devices 5 can be widened. Accordingly, fluctuations of light emission in the light source unit 140 can be suppressed even though the semiconductor light emitting device 5 is disposed with a wider distance.

Figure 25:
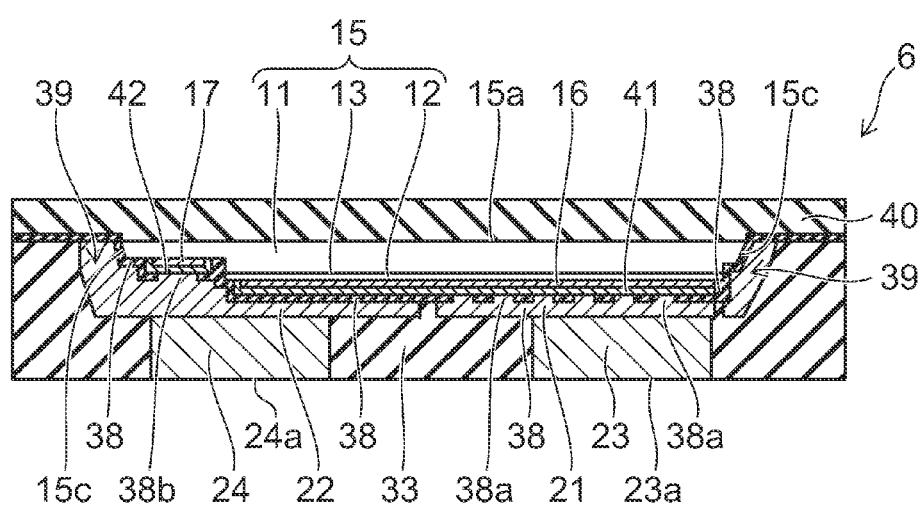
FIG. 25 is a schematic cross-sectional view illustrating a semiconductor light emitting device according to a variation of the fourth embodiment.

FIG. 25 is a schematic cross-sectional view of a semiconductor light emitting device 6 according to a variation of the fourth embodiment. For example, the semiconductor light emitting device 6 is mounted on the mounting substrate 150 instead of the semiconductor light emitting device 5.

The semiconductor light emitting device 6 includes the semiconductor layer 15. The semiconductor layer 15 includes the first face 15a and the second face 15b opposite to the first face 15a, and includes the semiconductor layer 11, the light emitting layer 13, and the semiconductor layer 12.

The semiconductor device 6 includes the p-side electrode 16 and the n-side electrode 17 on the second face 15b side of the semiconductor layer 15. The p-side electrode 16 is provided on the portion of the semiconductor layer 15 including the light emitting layer 13. The n-side electrode 17 is provided on the portion of the semiconductor layer 15 not including the light emitting layer 13. A p-side pad 41 and a n-side pad 42 are provided on the p-side electrode 16 and the n-side electrode 17 respectively.

The semiconductor device 6 further includes an insulating film 38, the p-side interconnection, the n-side interconnection, and the insulating film 33. The insulating film 38 covers the semiconductor layer 15, the p-side pad 41 and the n-side pad 42. The p-side interconnection and the n-side interconnection are provided on the insulating film 38. The p-side interconnection is electrically connected to the p-side electrode 16 through an opening 38a provided in the insulating film 38. The n-side interconnection is electrically connected to the n-side electrode 17 through an opening 38b provided in the insulating film 38.

For example, the p-side interconnection includes a p-side interconnection layer 21 connected to the p-side pad 41 and a p-side metal pillar 23 provided on the p-side interconnection layer 21. The n-side interconnection includes an n-side interconnection layer 22 connected to the n-side pad 42 and an n-side metal pillar 24 provided on the n-side interconnection layer 22. The n-side interconnection layer 22 includes a portion 39 extending so as to cover the side face of the semiconductor layer 15.

For example, the p-side interconnection layer 21 covers the insulating film 38 and the p-side pad 41. The n-side interconnection layer 22 covers the insulating film 38, the n-side pad 42 and a side face 15c of the semiconductor layer 15. For example, the p-side interconnection layer 21 and the n-side interconnection layer 22 are formed by Cu electric field plating. The insulating film 33 is provided between the p-side interconnection and the n-side interconnection, and covers the p-side interconnection layer 21, the n-side interconnection layer 22, the side face of the p-side metal pillar 23 and the side face of the n-side metal pillar 24.

On the other hand, an insulating layer 40 is provided on the first face side of the semiconductor layer 15. For example, an inorganic film, such as a silicon oxide film and like may be used for the insulating layer 40. A resin layer that transmits the light emitted from the light emitting layer 13 may also be used for the insulating layer 40. Alternatively, the semiconductor light emitting device may have a structure without the insulating layer 40.

In the semiconductor light emitting device 6 according to the embodiment, the extending portion 39 of the n-side interconnection layer 22 covers the side face of the semiconductor layer 15. Thereby, light emitted from the side face is suppressed in the semiconductor light emitting device 6. Therefore, when a plurality of the semiconductor light emitting devices 6 are mounted on the mounting substrate 150, it becomes possible to suppress interference between the lights emitted from the side faces of the semiconductor light emitting devices 6. Namely, using the semiconductor light emitting device 6 may suppress the fluctuations of the light emission, and implements a surface light source with uniform light emission.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
    a semiconductor layer having a first face and a second face opposite to the first face, and including a light emitting layer;
    a p-side electrode provided on the semiconductor layer on the second face side;
    an n-side electrode provided on the semiconductor layer on the second face side;
    an inorganic film covering the first face of the semiconductor layer; and
    a resin layer which is provided on the inorganic film, and transmits light emitted from the light emitting layer, the resin layer including a top surface opposite to the inorganic film and four side faces provided along an outer edge of the inorganic film and connected to the top surface, and the resin layer including a scattering substance which scatters the light emitted from the light emitting layer.

2. The device according to claim 1, wherein the scattering substance is a fine particle dispersed in the resin layer, and a grain size of the scattering substance is smaller than a peak wavelength of light emitted from the light emitting layer.

3. The device according to claim 2, wherein the scattering substance is silica or titanium oxide.

4. The device according to claim 1, wherein the inorganic film is a silicon nitride film.

5. The device according to claim 1, further comprising a first insulating film covering the semiconductor layer, the p-side electrode, and the n-side electrode.

6. The device according to claim 5, wherein the first insulating film covers a side face of the semiconductor layer connecting the first face to the second face, and the first insulating film contacts the inorganic film.

7. The device according to claim 5, wherein the first insulating film is an inorganic film.

8. The device according to claim 5, wherein the first insulating film is a silicon nitride film.

9. The device according to claim 5, further comprising:
    a p-side interconnection electrically connected to the p-side electrode; and
    an n-side interconnection electrically connected to the n-side electrode.

10. The device according to claim 9, further comprising a second insulating film provided on the first insulating film between the p-side interconnection and the n-side interconnection.

11. The device according to claim 10, wherein:
    the p-side interconnection includes a p-side interconnection layer electrically connected to the p-side electrode, and a p-side metal pillar connected to the p-side interconnection layer, the p-side metal pillar being thicker than the p-side interconnection layer; and
    the n-side interconnection includes an n-side interconnection layer electrically connected to the n-side electrode, and an n-side metal pillar connected to the n-side interconnection layer, the n-side metal pillar being thicker than the n-side interconnection layer.

12. The device according to claim 10, wherein the second insulating film is provided between the p-side interconnection and the n-side interconnection.

13. A light source unit comprising:
    a plurality of semiconductor light emitting devices, each of the plurality of semiconductor light emitting devices including:
        a semiconductor layer having a first face and a second face opposite to the first face, and including a light emitting layer;
        a p-side electrode provided on the semiconductor layer on the second face side;
        an n-side electrode provided on the semiconductor layer on the second face side;
        a first insulating film covering the semiconductor layer, the p-side electrode, and the n-side electrode;
        a p-side interconnection electrically connected to the p-side electrode;
        an n-side interconnection electrically connected to the n-side electrode; and a second insulating film provided on the first insulating film between the p-side interconnection and the n-side interconnection;
a mounting substrate including a plurality of interconnections, wherein the semiconductor light emitting devices are mounted on the mounting substrate, and wherein each of the plurality of semiconductor light emitting devices is electrically connected to another of the plurality of semiconductor light emitting devices via one of the plurality of interconnections and one of the p-side interconnection and the n-side interconnection;
a first resin layer covering the semiconductor light emitting devices mounted on the mounting substrate, wherein the first resin layer has a first portion provided on each of the semiconductor light emitting devices and a second portion provided on the mounting substrate between the semiconductor light emitting devices adjacent to each other, and wherein the first resin layer transmits lights emitted from the semiconductor light emitting devices; and
a second resin layer provided on the first portion and the second portion of the first resin layer, the second resin layer including fluorescent substances which are excited by the lights emitted from the semiconductor light emitting devices and emit lights having a wavelength different from a wavelength of the exciting lights.

14. The unit according to claim 13, wherein a refractive index of the first resin layer is greater than a refractive index of the first insulating film.

15. The unit according to claim 13, wherein the first resin layer includes a scattering substance configured to scatter light emitted from the light emitting layer.

16. The unit according to claim 15, wherein a distance between adjacent semiconductor light emitting devices is wider than a size of the semiconductor light emitting device in any arrangement direction on the mounting substrate.

17. The unit according to claim 13, wherein the semiconductor light emitting devices are disposed in a matrix configuration on the substrate.

18. The unit according to claim 13, wherein the semiconductor light emitting devices are disposed in a staggered configuration on the substrate.

19. The unit according to claim 13, wherein the semiconductor layer has a side face connected to the first face, wherein the first insulating film covers the side face, and the second portion of the first resin layer covers the side face via the first insulating film.

20. A light source unit comprising:
a plurality of semiconductor light emitting devices, each of the plurality of semiconductor light emitting devices including:
a semiconductor layer having a first face and a second face opposite to the first face, and including a light emitting layer;
a p-side electrode provided on the semiconductor layer on the second face side;
an n-side electrode provided on the semiconductor layer on the second face side;
a first insulating film covering the semiconductor layer, the p-side electrode, and the n-side electrode;
a p-side interconnection electrically connected to the p-side electrode;
an n-side interconnection electrically connected to the n-side electrode; and
a second insulating film provided on the first insulating film between the p-side interconnection and the n-side interconnection;
a mounting substrate including a plurality of interconnections, wherein the semiconductor light emitting devices are mounted on the mounting substrate, and wherein each of the plurality of semiconductor light emitting devices is electrically connected to another of the plurality of semiconductor light emitting devices via one of the plurality of interconnections and one of the p-side interconnection and the n-side interconnection;
a first resin layer covering the semiconductor light emitting devices mounted on the mounting substrate, wherein the first resin layer covers the semiconductor light emitting devices in an island shaped arrangement, and transmits lights emitted from the semiconductor light emitting devices;
a second resin layer provided on the first resin layer, and covering the mounting substrate, wherein the second resin layer includes fluorescent substances which are excited by the lights emitted from the semiconductor light emitting devices, and emit lights having a wavelength different from a wavelength of the exciting lights; and
a third resin layer provided on the mounting substrate between adjacent semiconductor light emitting devices, wherein the second resin layer is provided on the third resin layer, and the third resin layer includes a phosphor which has a light emission period longer than a light emission period of the fluorescent substances.

21. The light source unit according to claim 20, wherein the semiconductor layer has a side face connected to the first face, wherein the first insulating film covers the side face, and the third resin layer covers the side face via the first insulating film.

* * * * *